(12) United States Patent
Suzuki

(10) Patent No.: US 6,229,159 B1
(45) Date of Patent: May 8, 2001

(54) SILICON-BASED FUNCTIONAL MATRIX SUBSTRATE AND OPTICAL INTEGRATED OXIDE DEVICE

(75) Inventor: Masayuki Suzuki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/386,731

(22) Filed: Aug. 31, 1999

Related U.S. Application Data

(62) Division of application No. 09/143,051, filed on Aug. 28, 1998, now Pat. No. 6,100,578.

(30) Foreign Application Priority Data

Aug. 29, 1997 (JP) .................................................. 9-234217

(51) Int. Cl.$^7$ .......................... H01L 27/15; H01L 31/12; H01L 31/153; H01L 33/00
(52) U.S. Cl. ................. 257/84; 257/80; 257/85; 257/98; 257/103; 257/431
(58) Field of Search ................................. 257/13, 79–103

(56) References Cited

U.S. PATENT DOCUMENTS

| | | | |
|---|---|---|---|
| 3,994,012 | * 11/1976 | Warner, Jr. | 136/246 |
| 4,479,297 | 10/1984 | Mizutani et al. | 438/295 |
| 4,857,746 | * 8/1989 | Kuhlmann et al. | 250/551 |
| 4,989,934 | * 2/1991 | Zavracky et al. | 350/96.11 |
| 5,156,004 | * 10/1992 | Wu et al. | 62/3.1 |
| 5,780,875 | * 7/1998 | Tsuji et al. | 287/81 |
| 5,834,803 | 11/1998 | Nashimoto | 257/152 |

FOREIGN PATENT DOCUMENTS

| | | |
|---|---|---|
| 60-182745 | 9/1985 | (JP) . |
| 61-135172 | 8/1986 | (JP) . |
| 8-167740 | 6/1996 | (JP) . |
| 10-270653 | 10/1998 | (JP) . |

* cited by examiner

Primary Examiner—Eddie C. Lee
Assistant Examiner—Allan R. Wilson
(74) Attorney, Agent, or Firm—Sonneschein Nath & Rosenthal

(57) ABSTRACT

An optical integrated oxide device uses a silicon-based functional matrix substrate on which both an oxide device and a semiconductor light emitting device can be commonly integrated with an optimum structure and a high density. A single-crystal Si substrate has formed on its surface a first region where a cleaned surface of the single-crystal Si substrate itself appears, and a second region in which a $CeO_2$ thin film is preferentially (100)-oriented or epitaxially grown on the single-crystal Si substrate. A semiconductor laser is integrated in the first region by epitaxial growth or atomic layer bonding, and an optical modulation device or optical detection device made of oxides are formed in the second region, to make up an optical integrated oxide device. A $MgAl_2O_4$ thin film may be used instead of $CeO_2$ thin film.

18 Claims, 14 Drawing Sheets

SILICON-BASED FUNCTIONAL MATRIX SUBSTRATE AND OPTICAL INTEGRATED OXIDE DEVICE

RELATED APPLICATION DATA

This application is a division of U.S. application Ser. No. 09/143,051 filed Aug. 28, 1998, now U.S. Pat. No. 6,100,578. The present and foregoing application claim priority to Japanese application No. P09-234217 filed Aug. 29, 1997. These applications are incorporated herein by reference to the extent permitted by law.

BACKGROUND OF THE INVENTION

1. Field of the Invention

This invention relates to a silicon-based functional matrix substrate and an optical integrated oxide device, especially suitable for use in optical integrated oxide electronics spread out on silicon.

2. Description of the Related Art

It is a well-known fact that oxide thin film materials have been remarkably developed in recent several years, starting from high-temperature superconductive oxides reported in 1986 ((1) Z. Phys. B., 64, 189–193(1986), (2) MRS Bulletin, XVII, No. 8, 16–54(1992), (3) MRS Bulletin, XIX, No. 9, 21–55(1994)).

On the other hand, memory devices using ferroelectric materials, which were energetically studied in a certain period of 1950s ((4) Electrical Engineering, 71, 916–922 (1952), (5) Bell Labs. Record, 33, 335–342(1955)) but failed to penetrate into industries because of difficulties in, for example, controlling interfaces, have recently come to be highlighted, and researches and developments thereon have progressed rapidly. The current aspect of the ferroelectric nonvolatile memory devices were reported in detail (for example, (6) Appl. Phys. Lett., 48, 1439–1440(1986), (7) U.S. Pat. No. 4,713,157, (8) IEDM Tech. Dig., 850–851 (1987), (9) IEEE J. Solid State Circuits, 23, 1171–1175 (1988), (10) Tech. Dig. ISSCC 88, 130–131 (1988), (11) Applied Physics, Vol. 62, No. 12, 1212–1215(1993), (12) Electronic Ceramics, Vol. 24, July, 6–10(1993), (13) Electronic Materials, Vol. 33, No. 8 (1994) (Special Vol. entitled "Application of Ferroelectric Thin Films to Nonvolatile Memory"), (14) Ceramics, Vol. 27, 720–727(1992)).

It is needless to say so on oxide superconductive devices (see Literatures (2) and (3)), it is well known also that researches and developments have been proceeded recently on applications of oxide nonlinear optical devices and elements, as well. While fields of superconductive devices and ferroelectric nonvolatile memory devices are under remarkable development, in the field of optical devices, conciliation with lithographic techniques favorably used for silicon devices has not been prosecuted, as shown by the fact that bulk materials are still used, for example.

The Inventor, however, has recognized formerly that the importance of epitaxial thin films of oxides on silicon is not limited only to superconductive devices or ferroelectric nonvolatile memory device, and made some reports or proposals on oxide stacked structures made by stacking oxide thin films on silicon substrates and ferroelectric nonvolatile memory devices using them ((15) Japanese Patent Laid-Open No. Hei 8-330540, (16) Japanese Patent Laid-Open No. Hei 8-335672, (17) Japanese Patent Laid-Open No. Hei 8-340087, (18) Japanese Patent Application No. Hei 8-336158, (19) J. Ceram. Soc. Japan. Int. Edition, 103, 1088–1099(1995), (20) Mater. Sci. Eng. B., 41, 166–173 (1966).

On the other hand, in optical integrated oxide electronics, it is required to integrate a semiconductor laser or other semiconductor light emitting device together with an oxide optical device or other oxide device on a common substrate. However, as far as the Inventor is aware, there has been almost no substantial report on concrete device structures. Especially on optical integrated oxide devices in which oxide elements are formed by epitaxial growth of oxides, no report has been heard of.

OBJECT AND SUMMARY OF THE INVENTION

It is therefore an object of the invention to provide a silicon-based functional matrix substrate for integrating thereon an oxide device, such as oxide optical device, ferroelectric nonvolatile memory and oxide superconductive device, and a semiconductor light emitting device, such as semiconductor laser, in an optimum structure with a high density. Another object of the invention is to provide an optical integrated oxide device using the silicon-based functional matrix substrate.

To attain the object, the Inventor made specific researches on optimum structures, materials, processes, and so forth, for integrating an oxide device, such as oxide optical device, ferroelectric nonvolatile memory and oxide superconductive device, and a semiconductor light emitting device, such as semiconductor laser, on a common substrate. These researches are summarized below.

Selected as the substrate is a single-crystal silicon substrate which is a proven basic material of semiconductor memory, inexpensive, easily available and excellent in crystallographic property.

To make an oxide device on a single-crystal silicon substrate, it would be advantageous to epitaxially grow an oxide thin film on the single-crystal silicon substrate. Usually, however, it is difficult to epitaxially grow an oxide thin film directly on a single-crystal silicon substrate. It is therefore considered that a buffer layer of a material in lattice match with a single-crystal silicon substrate be first grown epitaxially or oriented preferentially on the single-crystal silicon substrate, and an oxide thin film in lattice match with the buffer layer be thereafter grown epitaxially on the buffer layer. In this manner, a material most suitable for the oxide device to be made can be selected from a wide variety of oxides. The buffer layer is preferably made of an oxide to ensure epitaxial growth of an oxide thin film thereon. The buffer layer made of an oxide is preferably epitaxially grown directly on the single-crystal silicon substrate.

Oxide materials that can be epitaxially grown directly on a single-crystal silicon substrate are currently only five, namely, magnesium oxide (MgO), cerium oxide (ceria) ($CeO_2$), α alumina ($\alpha$-$Al_2O_3$), yttrium stabilized zirconium (YSZ) and magnesium aluminum spinel ($MgAl_2O_4$), as shown in Table 1. This does not mean that the other oxides have been proved not to epitaxially grow directly on single-crystal silicon substrates, and there might be one or more, other than the above five oxides, which can be epitaxially grown directly. Table 1 shows lattice constants (a, c) of oxide crystals and thermal expansion coefficients (α) (some of the data relies on "Structure and Properties of Inorganic Solids" by F. S. Galasso (Int. Series of Monographs in Solid State Physics, Vol.7). The lattice constant and thermal expansion coefficient of silicon (Si) are a=0.5430884 nm and α=3.0×$10^{-6}$/K, respectively.

TABLE 1

| Oxide Crystal | Type of Crystal Structure | Lattice Constant (nm) | $\alpha[10^{-6}/K]$ |
|---|---|---|---|
| MgO | halite: NaCl | a = 0.4213 | 13.6 |
| $CeO_2$ | fluorite: $CaF_2$ | a = 0.5411 | 8.9 |
| $\alpha-Al_2O_3$ | corundum: $\alpha-Al_2O_3$ | a = 0.476 c = 1.299 | 8.3 |
| YSZ | halite: $CaF_2$ | a = 0.514 ($a_P$ = 3.63) | 7.6 ($ZrO_2$) |
| $MgAl_2O_4$ | spinel: $MgAl_2O_4$ | a = 0.8083 | 7.18 |

Among these oxide materials, MgO, $CeO_2$, $\alpha-Al_2O_3$, YSZ and $MgAl_2O_4$, $CeO_2$ and $MgAl_2O_4$ are most prospective because they are less subject to problems by diffusion of their component elements, and promise a higher possibility of epitaxial growth of perovskite oxides thereon. However, both have merits and demerits. FIG. 1 shows dependency of lattice constants on temperature on $CeO_2$ and $MgAl_2O_4$ together with dependency of the lattice constant of Si on temperature.

As shown in FIG. 1, $CeO_2$ is much more excellent than $MgAl_2O_4$ from the viewpoint of lattice match with the single-crystal silicon substrate (when its surface orientation is (100)). However, as to crystallographic stacking alignment when lattice match is established, $MgAl_2O_4$ was very easy for perovskite oxide ($ABO_3$) to be stacked thereon, but there was a serious technical bar in front of $CeO_2$, as shown in FIGS. 2 and 3.

That is, there are many reports stating that $CeO_2(100)$ does not epitaxially grow even on Si(100), but $CeO_2(110)$ epitaxially grows thereon. Actually, almost all on $CeO_2$ among these reports conclude that nothing but $CeO_2(110)$/Si(100) structure is obtained ((21) Appl. Phys. Lett., 59, 3604–3606(1991)). Therefore, in the crystallographic stacking alignment, it is considered difficult to epitaxially grow a perovskite oxide in (100) orientation thereon.

The Inventor et al., however, succeeded in fabricating a highly oriented film of $CeO_2/(100)/Si(100$ by MOCVD (metal organic chemical vapor deposition). Details of the study were already reported ((18) Japanese Patent Application No. 8-336158, (22) 3rd TIT International Symposium on Oxide Electronics (Yokohama, Dec. 18–20, 1996), (23) Japanese Patent Application No. 8-337241).

Therefore, the Inventor recognized that no substantial technical bar stood against realization of $CeO_2(100)$/Si (100). As a result, it has become possible to realize crystallographically complete epitaxial growth of the perovskite oxide, $ABO_3(100)$, on $CeO_2$ as shown in FIG. 4.

Under the background, the $CeO_2(100)/Si(100)$ structure and its manufacturing method proposed by the Inventor in Japanese Patent Application No. 8-336158 are important. The technique must be useful for integrating an oxide on a single-crystal silicon substrate.

As to $MgAl_2O_4$, since a $MgAl_2O_4$ thin film is an excellent base layer for making a GaAs semiconductor laser, GaN semiconductor laser, ZnO semiconductor laser, or the like, on a single-crystal silicon substrate, if it is used, all devices to be integrated on single-crystal silicon substrates can be made by merely growing thin films without atomic layer bonding, which will be discussed later.

Next discussed are upper electrodes of oxide devices. Platinum (Pt) electrodes are widely known electrodes for ferroelectric materials. (for example, (24) J. Appl. Phys., 70, 382–388(1991)). A typical example of ferroelectric nonvolatile memory devices using Pt electrodes is FeRAM having a structure having a PZT thin film sandwiched between a pair of Pt electrodes. However, such FeRAMs were often subjected to peeling-off of Pt electrodes or unacceptable fatigue characteristics showing changes with time. It is generally acknowledged that several factors, such as shortage of oxygen in the PZT thin film near interfaces with the Pt electrodes, fatigue of the bonding force caused by large spontaneous polarization value of PZT, namely, large lattice displacement thereof, and so forth, complexly interact, and cause these problems (for example, (25) J. Appl. Phys., 70, 382–388(1991)).

Since Pt involves a difficulty in processing thereof as well, and also from the viewpoint of preventing oxygen shortage along interfaces, the following oxide electrodes have come to be remarked.

Many were reported on $SrRuO_3$ electrodes for ferroelectric nonvolatile memory devices, for example, ((26) Science, 258, 1766–1769(1992), (27) Mater. Res. Soc. Symp. Proc., 310, 145–150(1993), (28) Appl. Phys. Lett., 63, 2570–2572 (1993), (29) Mater. Res. Soc. Symp. Proc., 341, 229–240 (1993), (30) E6.8, MRS Fall Meeting at Boston (Nov. 28, 1995), (31) Appl. Phys. Lett., 66, 2197–2199(1995)).

Many were reported also on $LaSrCoO_3$ here again for ferroelectric nonvolatile memory devices ((32) Appl. Phys. Lett., 63, 3592–3594(1993), (33) Appl. Phys. Lett., 64, 1588–1590(1994), (34) Appl. Phys. Lett., 64, 2511–2513 (1994), (35) Appl. Phys. Lett., 66, 1337–1339 (1995)).

There are many reports also on superconductive oxide electrodes such as YBCO phase and LSCO phase as electrode here again for ferroelectric nonvolatile memory devices ((36) Science, 252, 944– 946(1991), (37) Appl. Phys. Lett., 61, 1537–1539(1992), (38) Appl. Phys. Lett., 63, 27–29(1993), (39) Appl. Phys. Lett., 63, 30–32(1993), (40) J. Am. Ceram. Soc., 76, 3141–3143(1993), (41) Appl. Phys. Lett., 64, 1050–1052(1994), (42) Appl. Phys. Lett., 64, 3646–3648(1994), (43) Appl. Phys. Lett., 66, 2493–2495 (1995), (44) Appl. Phys. Lett., 64, 3181–383(1994), (45) Appl. Phys. Lett., 66, 2069–2071(1995), (46) Appl. Phys. Lett., 67, 554–556(1995), (47) J. Appl. Phys., 77, 6466–6471(1995), (48) J. Appl. Phys., 78, 4591–4595 (1995), (49) 5th Int. Supercond. Elec. Conf./ISEC '95 (September 18–21, Nagoya, Japan) (1995) pp.246–248, (50) Jpn. J. Appl. Phys., 33, 5182–5186(1994), (51) Physica C. 235–240, 739–740(1994), (52) Appl. Phys. Lett., 66, 299–301(1995), (53) Appl. Phys. Lett., 66, 1172–1174 (1995), (54) Appl. Phys. Lett., 67, 58–60(1995)).

Especially, it was reported that the use of a conductive oxide having a perovskite-related structure as an electrode material in the same manner as a ferroelectric layer not only would improve the residual polarization value (for example, (55) Mater. Res. Soc. Symp. Proc., 401, 139–149(1996)), but also would restore and improve the fatigue characteristics (for example, (56) Jpn. J. Appl. Phys., 33, 5207(1994)).

However, researches and developments made heretofore on ferroelectric nonvolatile memory devices, oxide superconductive devices and oxide optical devices using $LiNbO_3$, $LiTaO_3$, $KTa_{1-x}Nb_xO_3$, or the like (for example, (57) Mater. Res. Soc. Symp. Proc., 341, 253(1994), (58) Mater. Res. Soc. Symp. Proc., 341, 265(1994)) present no substantial consideration on substrates therefor, and problems remain unsolved. Actually, most of conventional oxide optical devices are single-bodied, and almost none are currently known on those using films grown on single-crystal silicon substrates. Considering that almost all are known on physical properties of ferroelectric bulk single crystals, it will be extremely difficult to find out new physical properties as bulk materials. However, under the technical concept of employment of epitaxial single crystals the present invention intends to realize, although the use of an oxide might enhance it, two dimensional compression stress (GPa grade) along the film plane. Therefore, there still remains the possibility of inducing nonlinear effects that have been unknown heretofore, such as optical deflection, optical modulation, higher harmonic waves (second harmonic waves, third harmonic waves, etc.), or ultrasonic physical properties, such as Raman-Nath scattering.

Based on the background, it is a reasonable approach to positively use conductive oxide thin films as electrodes during or at the final stage of a process for stacking oxide thin films on a single-crystal silicon substrate (see Literatures (15) through (20)).

As to conductive oxides as electrode materials of oxide devices, there are many groups of conductive oxides in oxides having perovskite crystal structures, and they all are candidates of the electrodes. Among these conductive oxides, examples of simple perovskite oxides expressed the general formula $ABO_3$ are as follows.

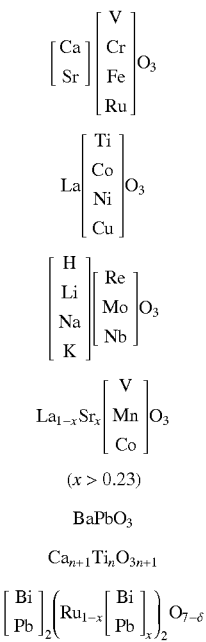

$(x > 0.23)$ $BaPbO_3$ $Ca_{n+1}Ti_nO_{3n+1}$ $\begin{bmatrix} Bi \\ Pb \end{bmatrix}_2 \left( Ru_{1-x} \begin{bmatrix} Bi \\ Pb \end{bmatrix}_x \right)_2 O_{7-\delta}$ Among conductive oxides, layered perovskite oxides include:

$(SrXO_3)(SrO)_n$ $n = 0, \frac{1}{3}, \frac{1}{2}, 1$ $X = Ru, Ir, Cr, ...$ $SrRuO_3$, $SrIrO_3$, $Sr_2RuO_4$ $Sr_2IrO_4$ are specific examples thereof.

Layered perovskite oxides further include $Ba_2RuO_4$, for example.

In addition to these, so-called high-temperature superconductive oxides are candidates of electrode materials. Some examples thereof are shown below.

$(La_{1-x}Sr_x)_2CuO_4$ $[x \leq 0.3]$ $(Nd_{1-x}Ce_x)_2CuO_{4-\delta}$ $[x \leq 0.1]$ $YBa_2Cu_3O_{7-\delta}$ $Bi_2Sr_2Ca_{n-1}Cu_nO_{2n+4}$ $[n \leq 4]$ $Tl_mBa_2Ca_{n-1}Cu_nO_{2n+4}$ $[m = 1 \text{ or } 2, n \leq 5]$ As shown above, there are a great deal of candidates of electrode materials. Among them, Sr—Ru(Ir)—O compounds and superconductive oxides are particularly interesting because of their non-diffusion property. In the former group, $SrRuO_3$, $Sr_2RuO_4$, $SrIrO_3$ and $Sr_2IrO_4$ are examples of optimum electrode materials because they maintain coherency of the perovskite crystal structures and are less subject to diffusion. The latter ultrasonic oxides have been reported to be effective in decreasing the size effect when the operation temperature is under the superconducting transitional temperature, and are hopeful as future materials ((59) Phys. Solid State, 36, 1778–1781(1994)).

Especially, $(Nd_{1-x}Ce_x)_2CuO_{4-d}$ which is so-called T' phase, is the material which was found to become superconductive by solid solution of Ce into the matrix material of $Nd_2CuO_4$ and introduction of oxygen defects by the Inventor et al. (for example, (60) Japanese Patent No. 2569780), and it is one of suitable materials for a device process requiring a high vacuum condition.

Regarding ferroelectric oxide thin film materials to be stacked on an buffer layer of $CeO_2$, four conditions must be satisfied, namely, having a lattice constant close to the lattice constant of $CeO_2$, having a perovskite-related crystal structure, having a high dielectric constant, having an excellent ferroelectricity, and as more practical requirement, causing no problem of diffusion relative to the underlying buffer layer of $CeO_2$. Many of perovskite ferroelectric oxides $ABO_3$ will meet these requirements, as explained before.

Particularly, realization of the basic crystallographic stacking alignment $ABO_3(001)/CeO_2(100)/Si(100)$ on silicon not only enables the use thereof in some kinds of ferroelectric nonvolatile memory devices explained later, but also promises many advantages.

Moreover, from the viewpoint that making good interfaces of $ABO_3(001)/CeO_2(100)/Si(100)$ is indispensable to reliably prevent trapping which is problem from the electrical viewpoint, it will be undoubtedly effective for obtaining good interface to make second buffer layers of a material having the same perovskite crystal structure and including Ce which occupies its B site, namely, $RceO_3$ (R=Ba, Sr, Ca, Pb, Mg, Bi, Li, Ag, Na, K, Y, Ln). This is a material design supported from both the viewpoint of lattice match and the viewpoint of diffusion of elements. A basic crystallographic stacking alignment on Si, more improved in this sense, is $ABO_3(001)/RCeO_3(001)/CeO_2(100)/Si(100)$. The stacking alignment shown here can be realized by first stacking R atoms on the top surface of the buffer layer of $CeO_2$. In this case, it is important that the R atom alone is not stacked too much, and it is also important to promote diffusion of Ce atoms by appropriately controlling the substrate temperature or annealing temperature.

As to technologies for making a semiconductor laser or any other semiconductor light emitting device on a single-crystal silicon substrate, there is a method of first cleaning the surface of the single-crystal silicon substrate where the device is to be made, and by thereafter epitaxially growing a semiconductor layer directly on the cleaned area to make the semiconductor light emitting device. If direct epitaxial growth of the semiconductor layer on the single-crystal silicon substrate is difficult, there is another method of bonding the semiconductor light emitting device on the single-crystal silicon substrate by atomic layer bonding.

Here is explained the technology of atomic layer bonding (also called compression bonding). This is a technology that has recently come to be remarked (for example, (61) Kikai Gijutsu Kenkyujo-ho Vol. 50(1996) No. 3, 53–55, (62) Nippon Kinzoku Gakkai-shi, Vol. 55 No. 9, 1002–1010 (1991), (63) Electronic Ceramics Vol. 22 No. 113, 20–26 (1991)). The technology can firmly bond two solids without using any bonding agent. Briefly explaining, bonding surfaces of both solids are once treated in a high vacuum by ion milling. (ion etching) using argon ions, for example, to expose clean surfaces; and both solids are thereafter slowly brought into proper position and close relative contact still in a high vacuum. Due to the close contact, dangling bonds of atoms on the utmost surface of one solid bond to dangling bonds of atoms of the utmost surface of the other solid, and both solids are bound more firmly than ordinary inter-atom bonding force. Atomic layer bonding needs a vapor deposition apparatus and sputtering apparatus, or a high-vacuum or ultrahigh-vacuum apparatus such as molecular beam epitaxy (MBE) apparatus, and these apparatuses are required to contain means for positional alignment and be prepared for simultaneous ion etching. When atomic layer bonding is used, a separately prepared semiconductor light emitting device can be incorporated on a single-crystal silicon substrate.

The present invention has been made based on the above-explained consideration by the Inventor.

According to the first aspect of the invention, there is provided a silicon-based functional matrix substrate comprising:

a single-crystal silicon substrate having thereon a first region where the single-crystal silicon substrate itself appears, and a second region where a cerium oxide layer is preferentially oriented or epitaxially grown in the (100) orientation on the single-crystal silicon substrate.

According to the second aspect of the invention, there is provided a silicon-based functional matrix substrate comprising:

a single-crystal silicon substrate having thereon a first region where the single-crystal silicon substrate itself appears, and a second region where a magnesium aluminum spinel layer is preferentially oriented or epitaxially grown in the (100) orientation on the single-crystal silicon substrate.

According to the third aspect of the invention, there is provided a silicon-based functional matrix substrate comprising:

a cerium oxide layer preferentially oriented or epitaxially grown in (100) orientation on a single-crystal silicon substrate; and a magnesium aluminum spinel layer epitaxially grown in a selective region on the cerium oxide layer.

According to the fourth aspect of the invention, there is provided a silicon-based functional matrix substrate comprising:

a cerium oxide layer preferentially oriented or epitaxially grown in (100) orientation on a single-crystal silicon substrate; and a magnesium aluminum spinel layer epitaxially grown on the cerium oxide layer.

According to the fifth aspect of the invention, there is provided an optical integrated oxide device comprising:

a single-crystal silicon substrate having thereon a-first region where the single-crystal silicon substrate itself appears, and a second region where a cerium oxide layer is preferentially oriented or epitaxially grown in the (100) orientation on the single-crystal silicon substrate; and a semiconductor light emitting device formed on the first region by epitaxial growth.

According to the sixth aspect of the invention, there is provided an optical integrated oxide device comprising:

a single-crystal silicon substrate having thereon a first region where the single-crystal silicon substrate itself appears, and a second region where a magnesium aluminum spinel layer is preferentially oriented or epitaxially grown in the (100) orientation on the single-crystal silicon substrate; and a semiconductor light emitting device formed on the first region by epitaxial growth.

According to the seventh aspect of the invention, there is provided an optical integrated oxide device comprising:

a single-crystal silicon substrate having thereon a first region where the single-crystal silicon substrate itself appears, and a second region where a cerium oxide layer is preferentially oriented or epitaxially grown in the (100) orientation on the single-crystal silicon substrate; and a semiconductor light emitting device bonded on the first region by atomic layer bonding.

In the seventh aspect of the invention, typically, at least one of an optical modulation device and an optical detection device is formed on the cerium oxide film by epitaxial growth.

According to the eighth aspect of the invention, there is provided an optical integrated oxide device comprising:

a single-crystal silicon substrate having thereon a first region where the single-crystal silicon substrate itself appears, and a second region where a magnesium aluminum spinel layer is preferentially oriented or epitaxially grown in the (100) orientation on the single-crystal silicon substrate; and a semiconductor light emitting device bonded on the first region by atomic layer bonding.

In the eighth aspect of the invention, typically, one of an optical modulation device and an optical detection device is formed on the magnesium aluminum oxide film by epitaxial growth.

According to the ninth aspect of the invention, there is provided an optical integrated oxide device comprising:

a cerium oxide layer preferentially oriented or epitaxially grown in the (100) orientation on a single-crystal substrate, and a magnesium aluminum spinel layer epitaxially grown in a selective region on the cerium oxide layer; and a semiconductor light emitting device formed on the magnesium aluminum spinel layer by epitaxial growth, and at least one of an optical modulation device and an optical detection device formed on the cerium oxide layer by epitaxial growth.

According to the tenth aspect of the invention, there is provided an optical integrated oxide device comprising:

a cerium oxide layer preferentially oriented or epitaxially grown in the (100) orientation on a single-crystal substrate, and a magnesium aluminum spinel layer epitaxially grown on said cerium oxide layer; and at least two of a semiconductor light emitting device, an optical modulation device and an optical detection device formed on the magnesium aluminum spinel layer formed by epitaxial growth.

In the present invention, the single-crystal silicon substrate is (100) oriented preferably, but (111) orientation is also acceptable in the second and sixth inventions.

The optical modulation device and optical detection device typically include a ferroelectric, piezoelectric or pyroelectric oxide thin film. These ferroelectric, piezoelectric or pyroelectric oxide thin films may be made of (Ba, Sr, Ca, Pb, Mg, Bi, Ag, Na, K, Y, Sb, Li, Ln)(Ti, Zr, Sn, Th, Ce, Ru, Rh, Ir, Cu, Ga, Al, Nb, Ta, Sb, Bi, Pb) $O_3$ (where Ba+Sr+Ca+Pb+Mg+Bi+Ag+Na+K+Y+Sb+Li+Ln=1, Ti+Zr+Sn+Th+Ce+Ru+Rh+Ir+Cu+Ga+Al+Nb+Ta+Sb+Bi+Pb=1) having a perovskite crystal structure, ilmenite crystal structure or $GdFeO_3$ crystal structure, or may be made of an oxide artificial superlattice including two or more kinds of oxide thin films.

The semiconductor light emitting device is typically a semiconductor laser. For example, it may be a GaAs semiconductor laser for red emission, ZnSe semiconductor laser for blue-green emission, GaN semiconductor laser for blue emission, ZnO semiconductor laser for ultraviolet emission ((64) 23rd Int. Conf. on the Physics of Semiconductors, 2, 1453–1456(1996), (65) 25th Thin Film and Surface Physics Seminar (held by Oyo Butsuri Gakkai), Jul. 24–25, 1997, 39–44), for example. Among them, the GaAs semiconductor laser and the ZnSe semiconductor laser had better be bonded by atomic layer bonding because epitaxial growth thereof on the single-crystal silicon substrate is difficult. The GaN semiconductor laser and the ZnO semiconductor laser, however, can be made by epitaxial growth on the single-crystal silicon substrate, and need not rely on atomic layer bonding. When the ZnO semiconductor laser is made by epitaxial growth on the single-crystal silicon substrate, for example, a (0001)-oriented sapphire ($Al_2O_3$) thin film may be first epitaxially grown on a (100)-oriented single-crystal Si substrate, and, thereafter, a (0001)-oriented ZnO thin film may be epitaxially grown thereon.

In the case where a $ABO_3$ layer with a perovskite crystal structure is grown on a cerium oxide layer on the single-crystal silicon substrate, it is recommended to first grow on the cerium oxide layer a $RCeO_3$ layer (where R=Ba, Sr, Ca, Mg) having the same perovskite crystal structure and having B site occupied by Ce as a second buffer layer and to grow the $ABO_3$ layer thereon. This is recommendable from both the viewpoint of lattice match and the viewpoint of diffusion of elements. In this case, the $RCeO_3$ used as the second buffer layer functions to maintain crystallographic coherency with the $CeO_2$ layer as the first buffer layer and to banish electric traps by removing crystalline defects. When a conductive oxide thin film is stacked as an electrode on the $ABO_3$ layer, since the conductive oxide thin film exhibit good adhesion and crystallographic coherence to the conductive oxide thin film, it is free from peel-off and tie problem of fatigue probably caused by a space charge layer. This applied not only to oxide devices but also to ferroelectric nonvolatile memory devices and superconductive devices.

The invention may interpose an amorphous layer having a thickness not larger than 20 nm, typically a thickness of several nm to decades nm, between the single-crystal silicon substrate and the overlying cerium oxide layer or magnesium aluminum spinel layer.

If necessary, the optical integrated oxide device may be bonded to an electronic refrigerating device, such as compact Peltier device, for cooling purposes.

In the invention having the structure explained above, by using the silicon-based functional matrix substrate having formed a cerium oxide layer or a magnesium aluminum spinel layer as a buffer layer on the single-crystal silicon substrate, any oxide device, such as semiconductor light emitting device, optical modulation device or optical detection device, can be integrated thereon by epitaxial growth or atomic layer bonding. In this case, at least oxide devices can be integrated in a high density because they can be made by first epitaxially growing an oxide thin film and by thereafter patterning the oxide thin film by lithography. As to semiconductor light emitting devices, such as GaAs semiconductor lasers or ZnSe compound semiconductor lasers, which are difficult to make by epitaxial growth on the single-crystal silicon substrate, they can be stacked on the single-crystal silicon substrate by atomic layer bonding, and any desired semiconductor light emitting device can be integrated. Moreover, various devices such as semiconductor light emitting device, optical modulation device, optical detection device and so on, can be integrated on a common single-crystal silicon substrate. Therefore, the invention makes optical signal processing very easy. Furthermore, the device characteristics can be improved remarkably, and a high performance of the optical integrated oxide device can be ensured, by using oxide thin film superlattice to make oxide thin films as functional thin films of the optical modulation device and the optical detection device or by using materials in which a large two-dimensional compression stress occurs.

Making oxide devices by epitaxial growth of ferroelectric thin films has the meaning of overcoming the size effect. The size effect pertains to whether a ferroelectric thin film maintains the ferroelectricity when decreased in thickness. This is the phenomenon that a tetragonal crystal (ferroelectric) stable under room temperature suddenly changes to a cubic crystal and loses the ferroelectricity when the grain size thereof becomes smaller than a critical grain size. Conventionally, it was discussed exclusively on particulates. That is, it is a change in physical property caused by three-dimensional decrease in size. The size effect of a $BaTiO_3$, for example, occurs at 0.1 μm. Also for a PZT polycrystalline thin film, the same effect has been obtained. The size effect can be suppressed significantly by designing the material of the epitaxial growth layer so as to appropriately introduce lattice distortion such as artificial superlattice.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Figure 1:
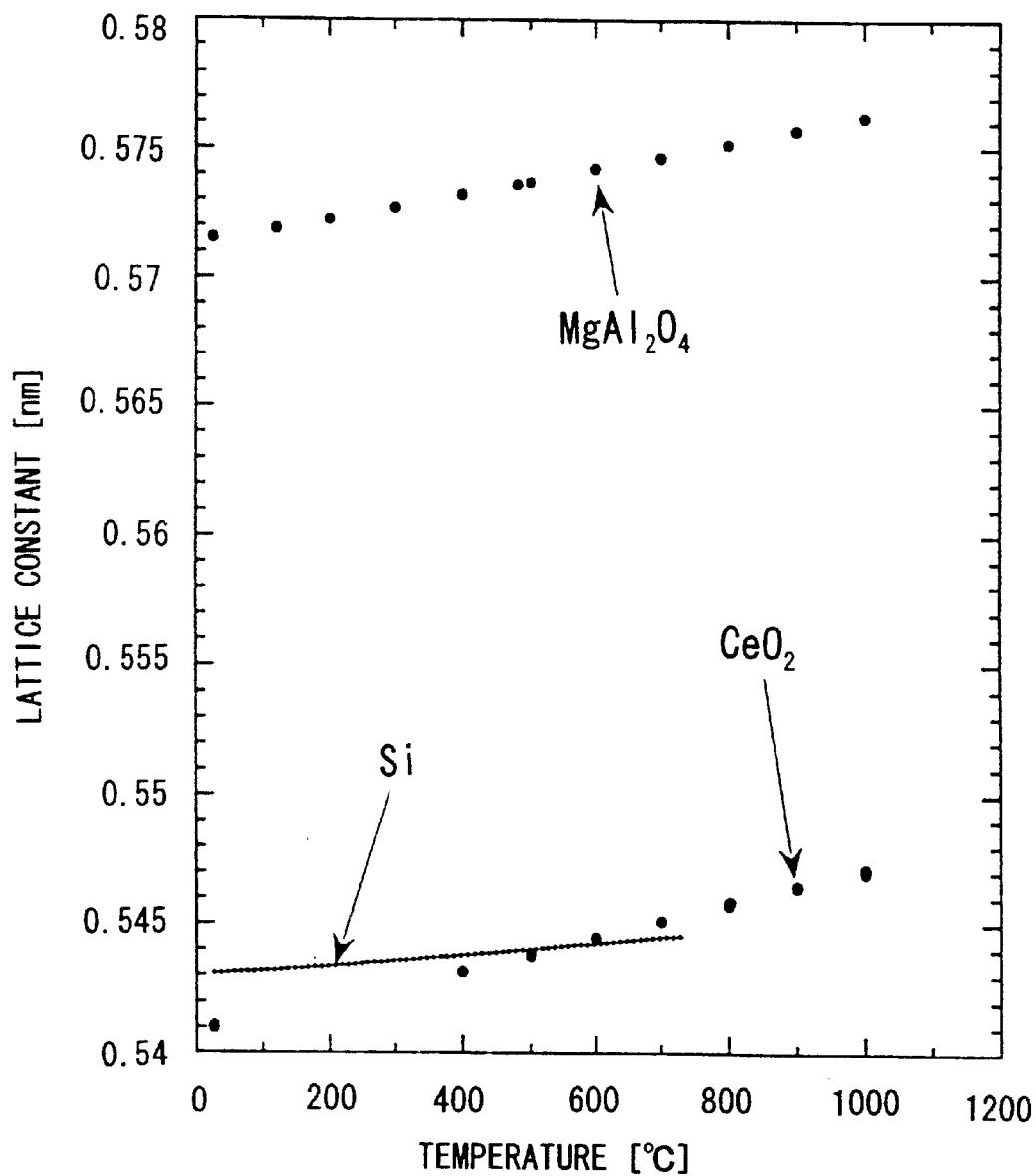
FIG. 1 is a schematic diagram showing changes in lattice constant of $MgAl_2O_4$ and $CeO_2$ with temperature together with changes in lattice constant of Si with temperature.
Figure 2:
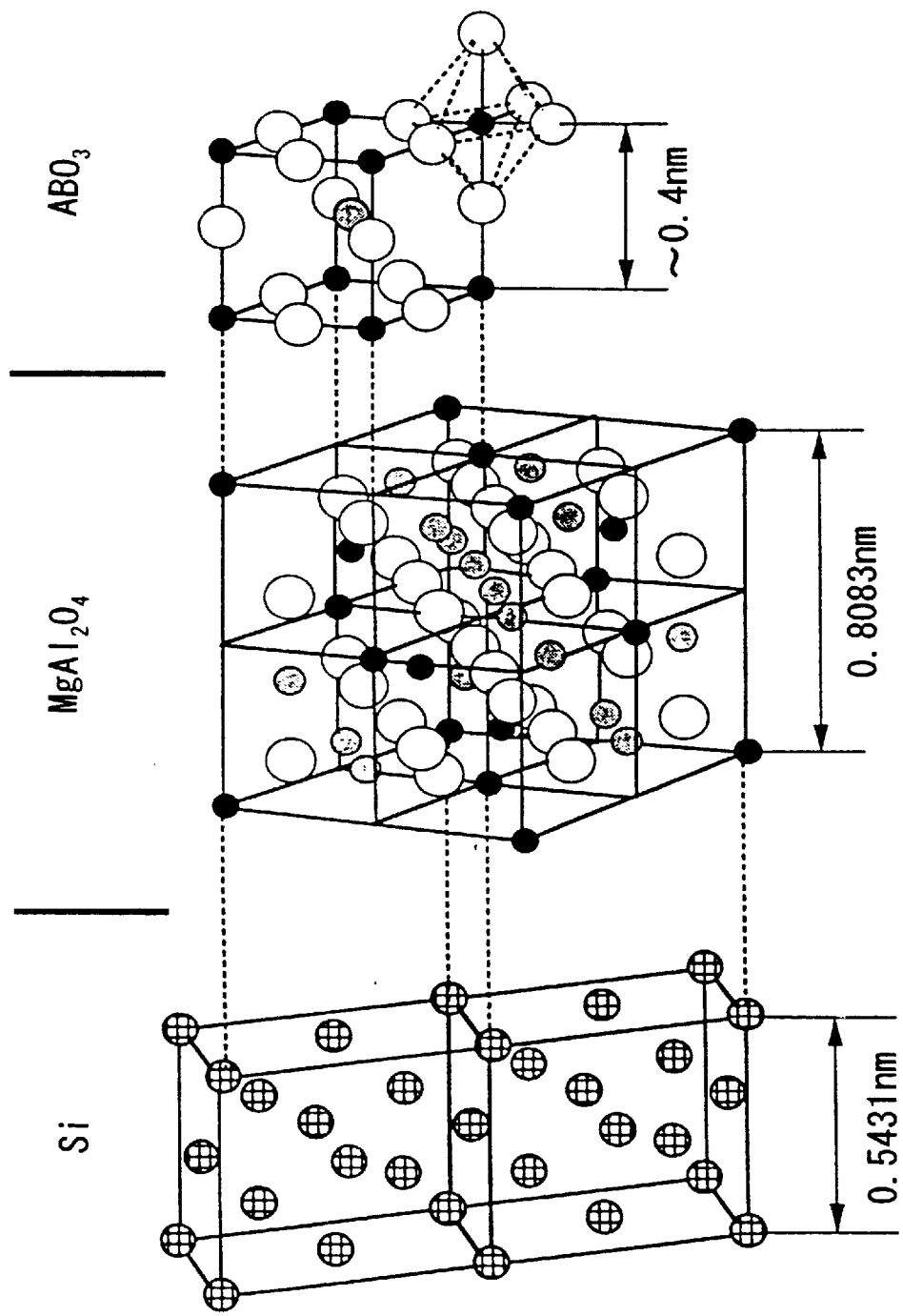
FIG. 2 is a schematic diagram showing a crystallographic stacked structure of $ABO_3$/$MgAl_2O_4$/Si (100)
Figure 3:
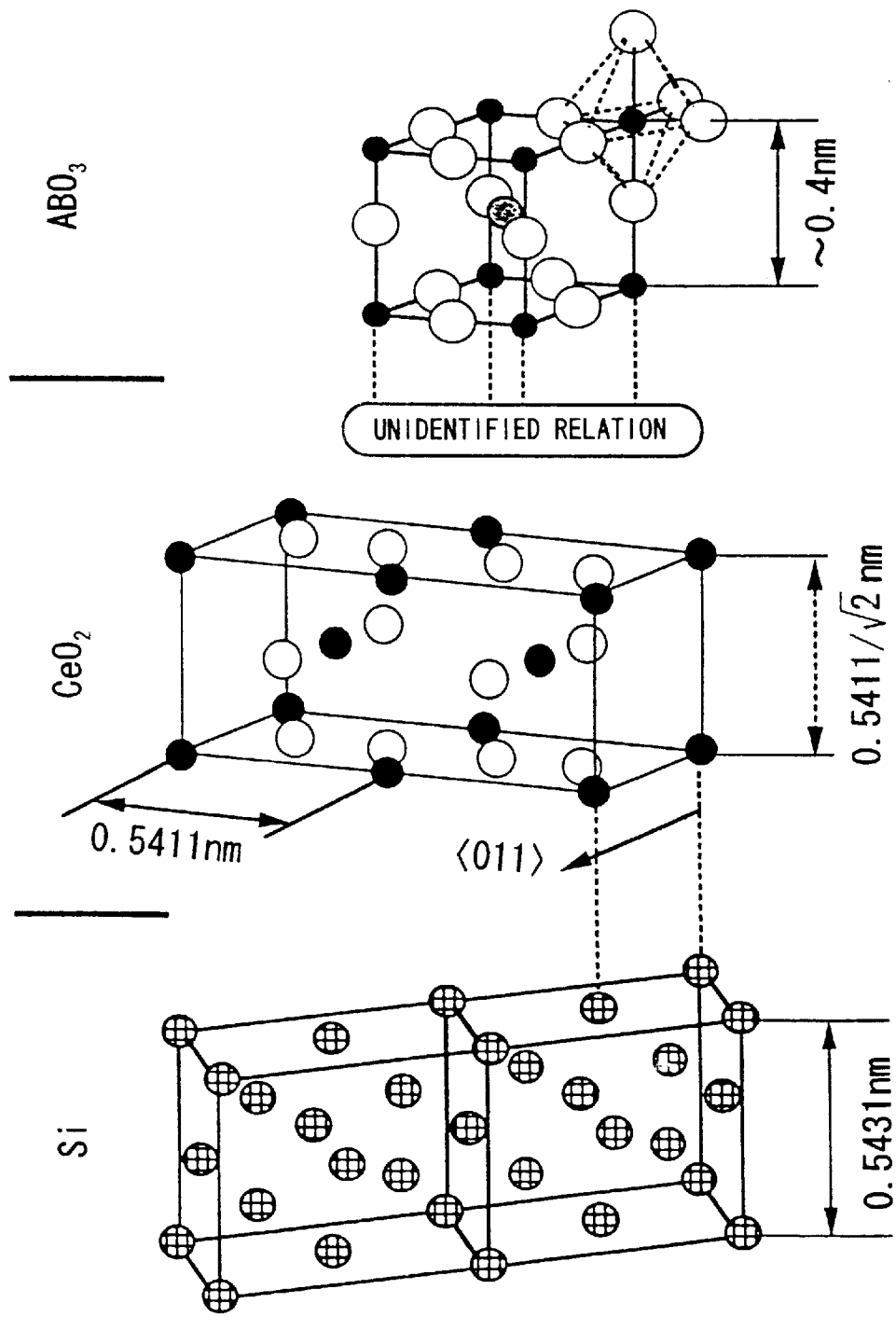
FIG. 3 is a schematic diagram showing a crystallographic stacked structure of $ABO_3$/$CeO_4$/Si (100)
Figure 4:
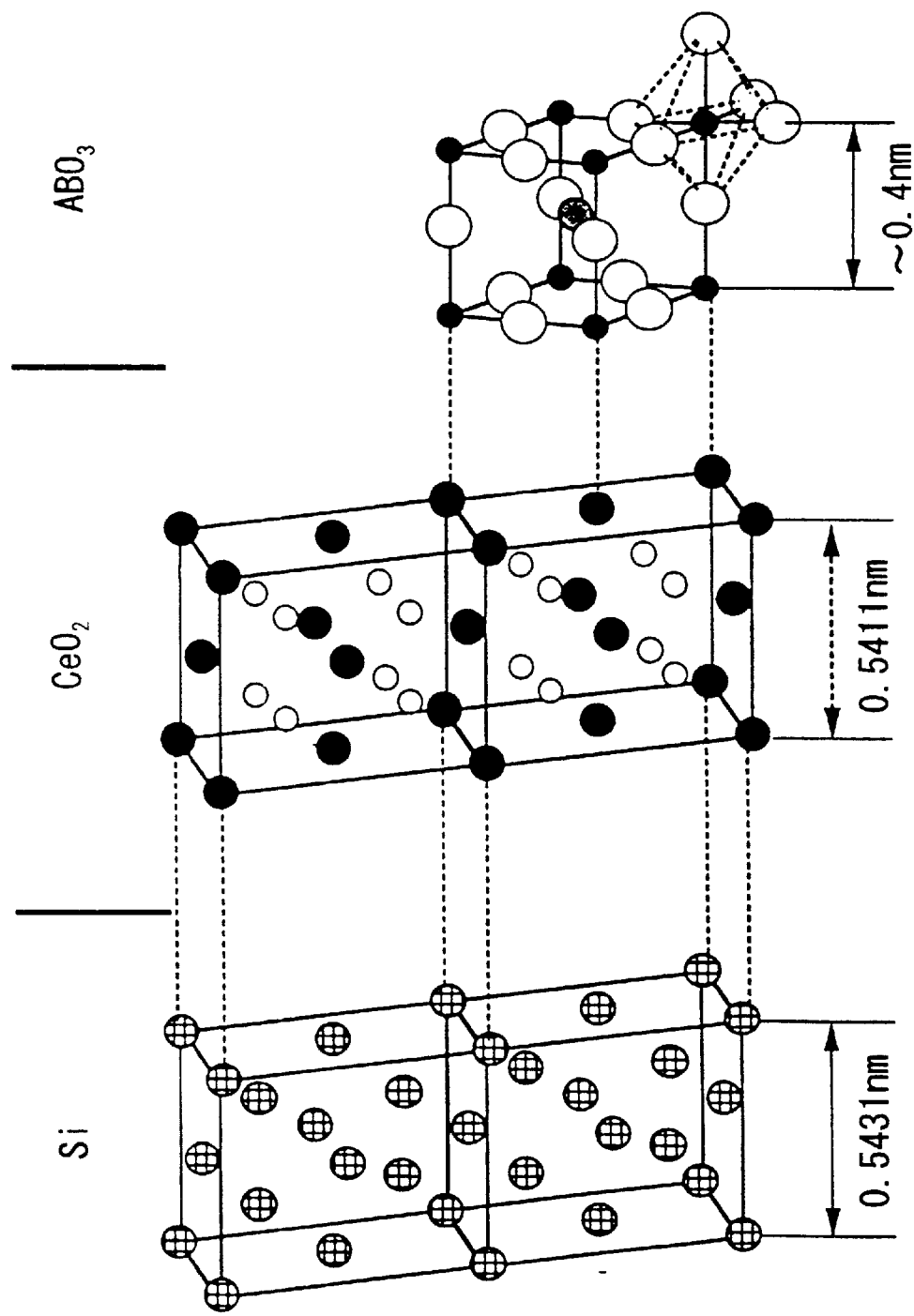
FIG. 4 is a schematic diagram showing a crystallographic stacked structure of $ABO_3$/$CeO_4$/Si (100)

Embodiments of the invention are described below with reference to the drawings. In all of the drawings showing embodiments of the invention, the same or equivalent elements are shown by common reference numerals.

Figure 5:
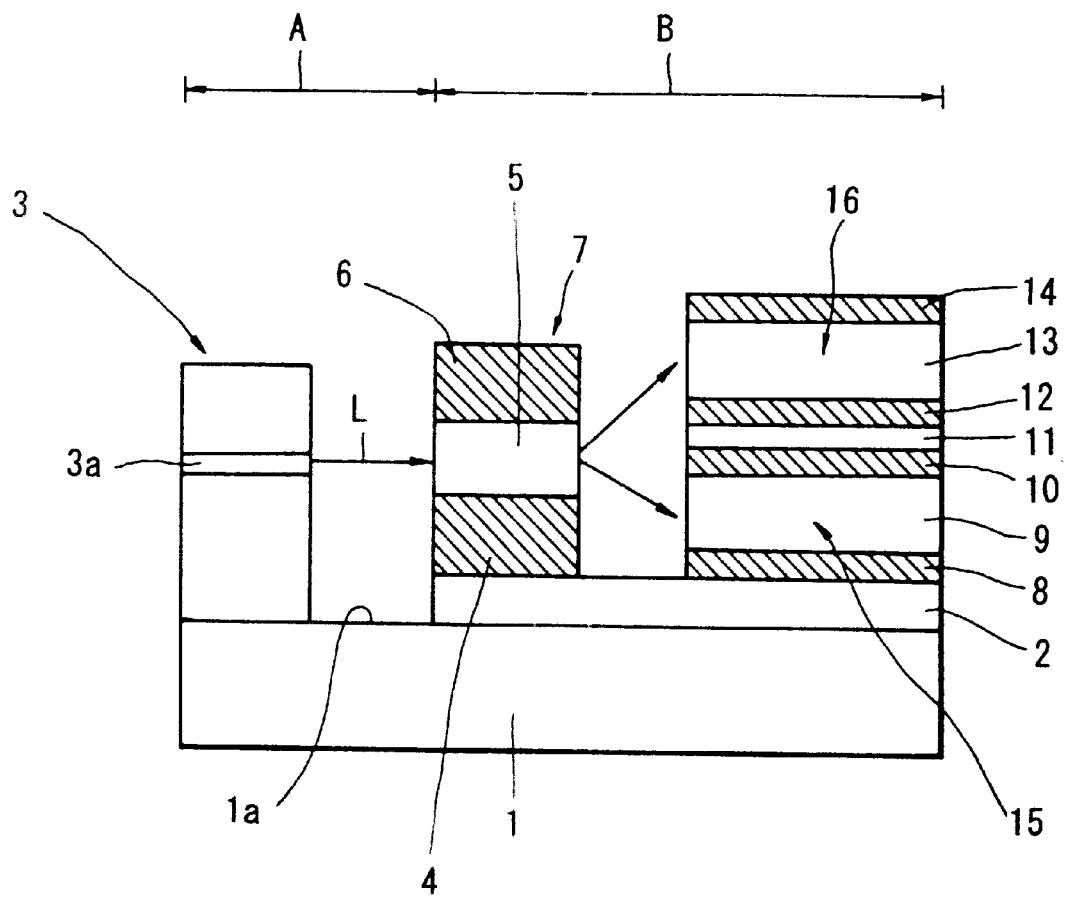
FIG. 5 is a cross-sectional view of an optical integrated oxide device according to the first embodiment of the invention.

FIG. 5 is an optical integrated oxide device according to the first embodiment of the invention.

As shown in FIG. 1, in the optical integrated oxide device according to the invention, a (100) oriented single-crystal Si substrate 1 has, on its surface, a region A where a cleaned surface of the single-crystal Si substrate 1 itself appears, and a region B on which a $CeO_2$ thin film 2 is preferentially (100) oriented or epitaxially grown on the single Si substrate 1. The $CeO_2$ thin film 2 serves as a buffer layer. The single-crystal Si substrate 1 may be either doped or non-doped with an impurity. Actually, a number of these regions A and B are made on the single-crystal Si substrate 1, but FIG. 1 shows only one pair for simplicity.

In the region A where the single-crystal Si substrate 1 itself is cleaned and appears, a GaAs semiconductor laser 3 made by stacking semiconductor layers on a GaAs substrate to form the laser structure overlies and is fixed thereon by bonding the bottom surface of the GaAs substrate thereof by atomic layer bonding. Reference numeral 3a denotes its active layer.

Sequentially stacked on a region of the $CeO_2$ thin film 2 are a (100) oriented $SrRuO_3$ thin film 4, (001) oriented PLZT thin film 5 and (100) oriented $SrRuO_3$ to form an optical modulation device 7. The $SrRuO_3$ thin film 4 and the $SrRuO_3$ thin film 6 serve as the lower electrode and the upper electrode, respectively. These $SrRuO_3$ thin films 4 and 6 have a specific resistance of 100 to 500 $\mu\Omega\cdot$cm, which is low enough to behave as electrodes. The PLZT thin film 5 is an optical thin film for optical modulation, having non-linear optical characteristics.

Sequentially stacked on another region of the $CeO_2$ thin film 2 are a (001) oriented $(Nd_{1-x}Ce_x)_2CuO_4$ thin film 8, (001) oriented $PbTiO_3$ thin film 9, (001) oriented $(Nd_{1-x}Ce_x)_2CuO_4$ thin film 10, (100) oriented $CeO_2$ thin film 11, (001) oriented $(Nd_{1-x}Ce_x)_2CuO_4$ thin film 12, (001) oriented $PbTiO_3$ thin film 13 and (001) oriented $(Nd_{1-x}Ce_x)_2CuO_4$ thin film 14. The $(Nd_{1-x}Ce_x)_2CuO_4$ $(Nd_{1-x}Ce_x)_2CuO_4$ thin film 8, $PbTiO_3$ thin film 9 and $(Nd_{1-x}Ce_x)_2CuO_4$ thin film 10 form a pyroelectric device behaving as an optical detection device 15. The $(Nd_{1-x}Ce_x)_2CuO_4$ thin film 12, $PbTiO_3$ thin film 13 and $(Nd_{1-x}Ce_x)_2CuO_4$ 14 form another pyroelectric device as another optical detection device 16. The $(Nd_{1-x}Ce_x)_2CuO_4$ thin film 8 and $(Nd_{1-x}Ce_x)_2CuO_4$ thin film 10 are used as the lower electrode and the upper electrode of the optical detection device 15, whereas the $PbTiO_3$ thin film 9 forms a pyroelectric thin film thereof. Similarly, the $(Nd_{1-x}Ce_x)_2CuO_4$ thin film 12 and $(Nd_{1-x}Ce_x)_2CuO_4$ thin film 14 are used as the lower electrode and the upper electrode of the optical detection device 16, whereas the $PbTiO_3$ thin film 13 forms a pyroelectric thin film thereof. The $CeO_2$ thin film 11 is an insulating layer for electrically insulating the optical detection devices 15 and 16 from each other.

In the optical integrated oxide device having the above-explained structure according to the first embodiment, light L emitted from the active layer 3a of the semiconductor laser 3 enters into the optical modulation device 7. Then, a voltage is applied across the $SrRuO_3$ thin film 4 as the lower electrode of the optical modulation device 7 and the $SrRuO_3$ thin film 6 as the upper electrode thereof to change the refractive index of the PLZT thin film 5 normal to the propagating direction of L. Thus the light L is diffracted. The diffraction angle of light L depends upon the length of the optical path for light passing through the optical modulation device 7 and its electrooptical constant. Therefore, by utilizing two-dimensional distortion in the PLZT thin film 5, which will be explained later, a large diffraction angle never attained heretofore can be obtained, and enables reliable signal processing.

Next explained is a manufacturing process of the optical integrated oxide device according to the first embodiment.

Figure 6:
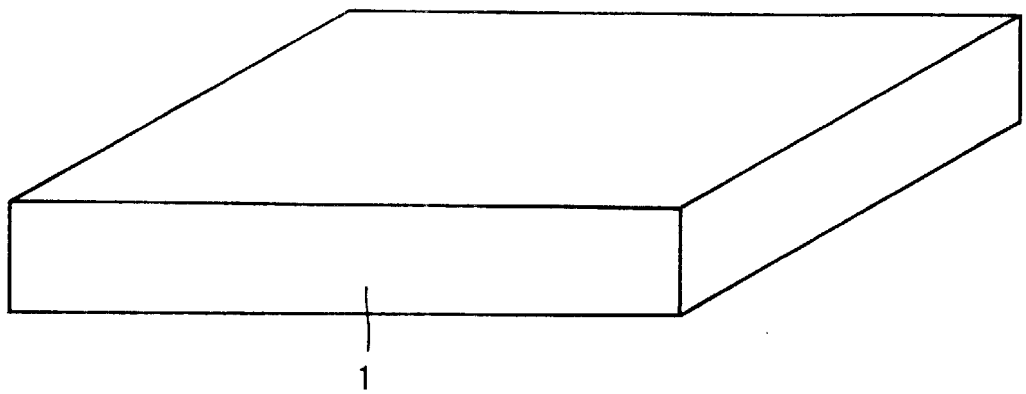
FIG. 6 is a perspective view for explaining a manufacturing process of the optical integrated oxide device according to the first embodiment of the invention.

First, a single-crystal Si substrate 1 as shown in FIG. 6 is prepared. Any size of the single-crystal Si substrate 1 is selected appropriately, but one with a large diameter as large as 8 inches may be used.

Figure 7:
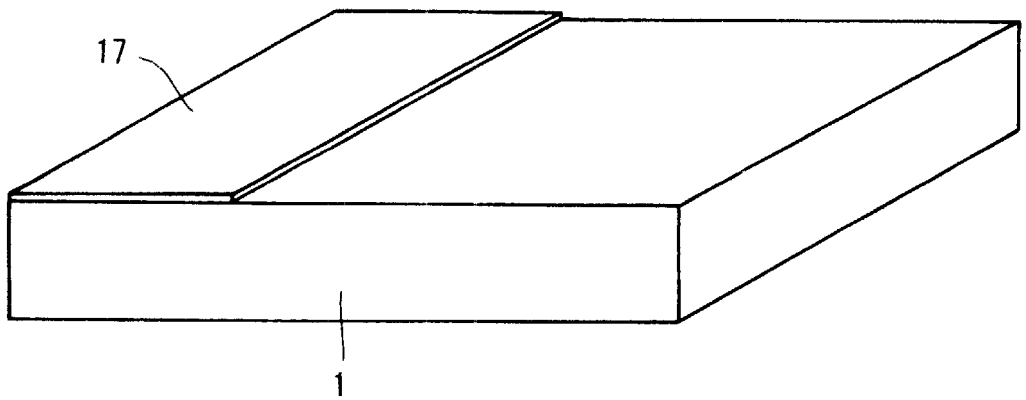
FIG. 7 is a perspective view for explaining a manufacturing process of the optical integrated oxide device according to the first embodiment of the invention.

Next as shown in FIG. 7, after the surface of the single-crystal Si substrate 1 is cleaned by RCA cleaning, the cleaned surface is covered with a mask 17. Any material is selected as the mask 17, such as Au.

Figure 8:
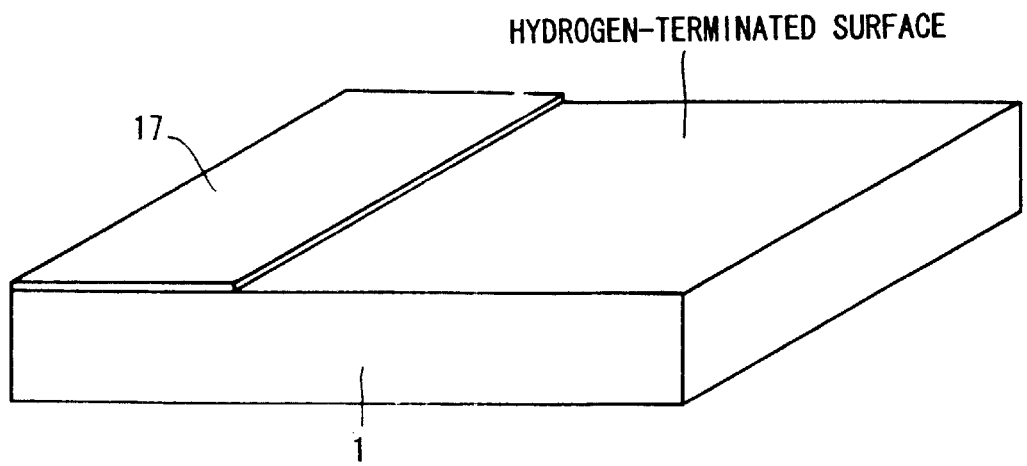
FIG. 8 is a perspective view of the optical integrated oxide device according to the first embodiment of the invention for explaining a manufacturing process thereof.

Next as shown in FIG. 8, part of the surface of the single-crystal Si substrate 1 not covered by the mask 17 is hydrogen terminated.

Figure 9:
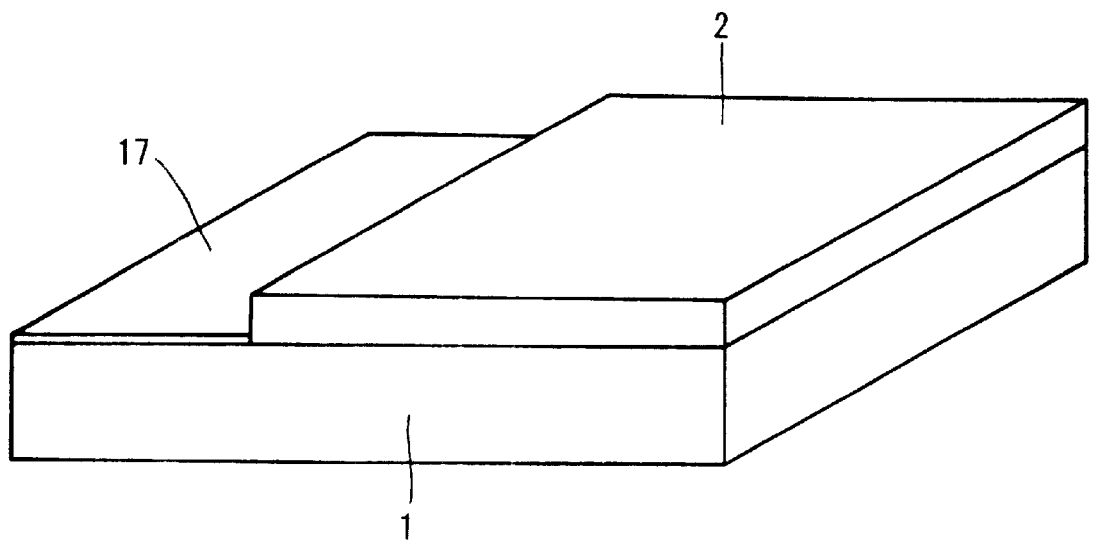
FIG. 9 is a perspective view of the optical integrated oxide device according to the first embodiment of the invention for explaining a manufacturing process thereof.

Next as shown in FIG. 9, the $CeO_2$ thin film 2 is epitaxially grown in the (100) orientation on the hydrogen-terminated part of the single-crystal Si substrate 1 not covered by the mask 17 by MOCVD. The epitaxial growth of the $CeO_2$ film 2 by MOCVD is performed in the following manner. Using a hot wall type reaction vessel, a metal organic compound material, $Ce(DPM)_4$ (often abbreviated to $Ce(thd)_4$. DPM pertains to di-pivaloyl methane, and thd is 2,2,6,6-tetramethyl-3,5-heptanedion) is used as the Ce source material. Used as the carrier gas is a mixed gas of argon (Ar) and oxygen ($O_2$). The reaction vessel is typically evacuated to 10 Torr or lower. During the epitaxial growth of the $CeO_2$ thin film 2 by MOCVD, if the substrate temperature exceeds 700° C., the $CeO_2$ thin film 2 epitaxially grown thereon gradually changes in surface orientation from (100) to (111). Therefore, the substrate temperature during growth is preferably set not to become higher than 700° C. On the other hand, if the substrate temperature goes down under 600° C., the $CeO_2$ thin film grown thereon seriously degrades in crystalline quality. Therefore, the optimum range of the substrate temperature is 600 to 700° C. The $CeO_2$ thin film 2 grown in this manner has a thickness in the range of 30 to 100 nm.

Figure 10:
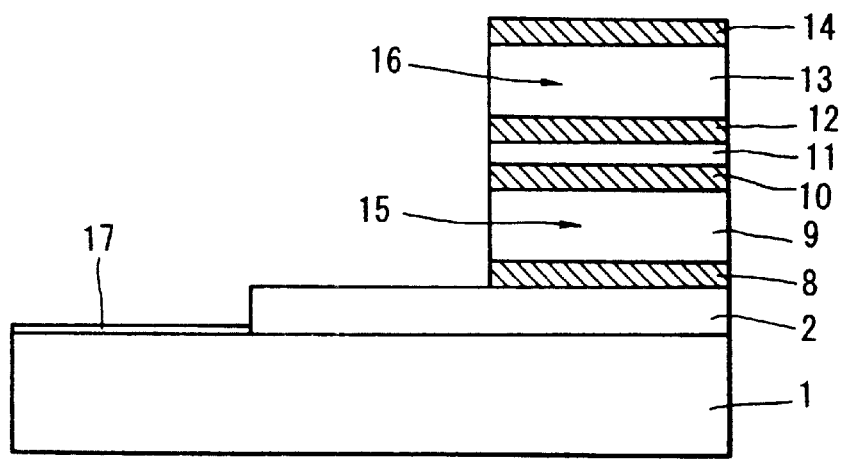
FIG. 10 is a cross-sectional view of the optical integrated oxide device according to the first embodiment of the invention for explaining a manufacturing process thereof.
Figure 11:
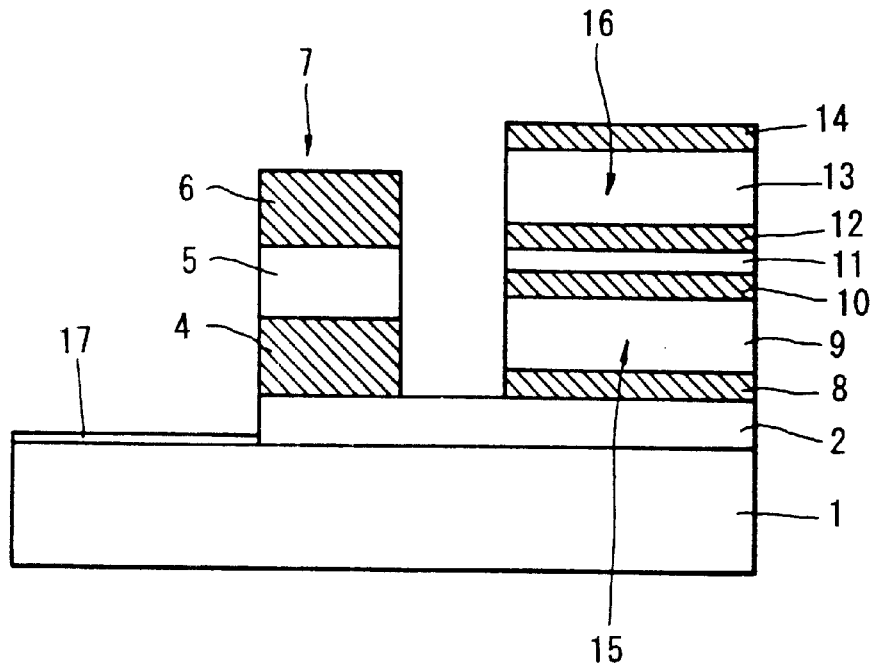
FIG. 11 is a cross-sectional view of the optical integrated oxide device according to the first embodiment of the invention for explaining a manufacturing process thereof.

Next, as shown in FIG. 10, the (001) oriented $(Nd_{1-x}Ce_x)_2CuO_4$ thin film 8 is epitaxially grown on the $CeO_2$ thin film 2 by MBE, for example. Here, the substrate temperature is set within 600 to 800° C., for example. If it is thereafter post-annealed at a temperature of 800° C., for example, the $(Nd_{1-x}Ce_x)_2CuO_4$ gets a higher electric conductivity due to self-diffusion of Ce from the $CeO_2$ thin film 2.

Next grown epitaxially is the (001) oriented $PbTiO_3$ thin film 9 by MBE. The epitaxial growth of the $PbTiO_3$ thin film 9 by MBE may be done as follows, for example. In an ultra-high vacuum container of an MBE apparatus, a vaporizing source of Ti using electron beams and a vaporizing source of Pb using Knudsen cell (K cell) are prepared. Then, while introducing well-controlled $O_2$ gas into the ultra-high vacuum container, maintaining the total pressure to approximately $10^{-4}$ Torr, appropriately controlling the Ti vaporizing rate by electron beams and the shutter of the K cell of Pb, detecting reflection high energy electron diffraction a (RHEED) oscillations, and using them for feedback control, the growth is progressed. During the growth, the substrate temperature should be set within 500 to 900° C., for example. More preferably, the temperature is 700° C. or higher to ensure a better quality film.

After that, in the same manner as already explained, epitaxially stacked sequentially are the (001) oriented $(Nd_{1-x}Ce_x)_2CuO_4$ thin film 10, (100) oriented $CeO_2$ thin film 11, (001) oriented $(Nd_{1-x}Ce_x)_2CuO_4$ thin film 12, (001) oriented $PbTiO_3$ thin film 13 and (001) oriented $(Nd_{1-x}Ce_x)_2CuO_4$ thin film 14.

Thereafter, a mask (not shown) made of $SiO_2$ is formed on the $(Nd_{1-x}Ce_x)_2CuO_4$ thin film 14. Then, using the mask, the $(Nd_{1-x}Ce_x)_2CuO_4$ thin film 14, $PbTiO_3$ thin film 13, $(Nd_{1-x}Ce_x)_2CuO_4$ thin film 12, $CeO_2$ thin film 11, $(Nd_{1-x}Ce_x)_2CuO_4$ thin film 10, $PbTiO_3$ thin film 9 and $(Nd_{1-x}Ce_x)_2CuO_4$ thin film 8 are patterned by etching. As a result, the optical detection devices 15 and 16 are obtained as shown in FIG. 10.

Next, while covering surfaces of the optical detection devices 15 and 16 with a mask (not shown) made of $SiO_2$, for example, the (100) oriented $SrRuO_3$ thin film 4 is grown epitaxially by MBE, for example. The $SrRuO_3$ thin film 4 is originally orthorhombic. During epitaxial growth, however, its crystal structure changes from a quasi perovskite structure to a perovskite structure.

Similarly, the PLZT thin film 4 and the $SrRuO_3$ thin film 5 are next epitaxially grown sequentially by MBE.

Then, the mask 17 is removed to expose the surface of the single-crystal Si substrate 1 heretofore covered.

Figure 12:
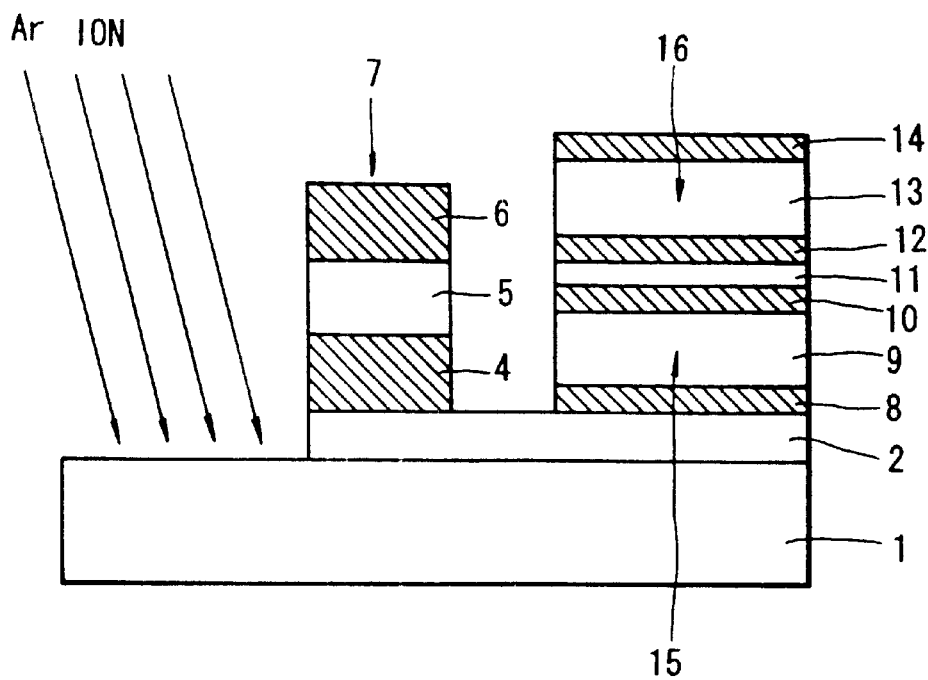
FIG. 12 is a cross-sectional view of the optical integrated oxide device according to the first embodiment of the invention for explaining a manufacturing process thereof.

Next, as shown in FIG. 12, the exposed surface of the single-crystal Si substrate 1 is cleaned by argon ion etching. On the other hand, the GaAs semiconductor laser 3 is prepared separately by epitaxially growing GaAs semiconductor layers on a GaAs substrate and by making the upper electrode. In the same ultra-high vacuum chamber, the bottom surface of the GaAs substrate of the GaAs semiconductor laser 3 is cleaned by argon ion etching. After that, in the same ultra-high vacuum chamber, the GaAs semiconductor laser 3 is properly positioned on the exposed surface of the single-crystal Si substrate 1, and the bottom surface of the GaAs substrate is brought into close contact with the surface of the surface of the single-crystal Si substrate 1. As a result, the surface of the single-crystal Si substrate 1 and the bottom surface of the GaAs substrate of the GaAs semiconductor laser 3 are bonded by atomic layer bonding.

After that, the single-crystal Si substrate 1 is divided into chips. As a result, the intended optical integrated oxide device shown in FIG. 5 is completed.

Figure 13:
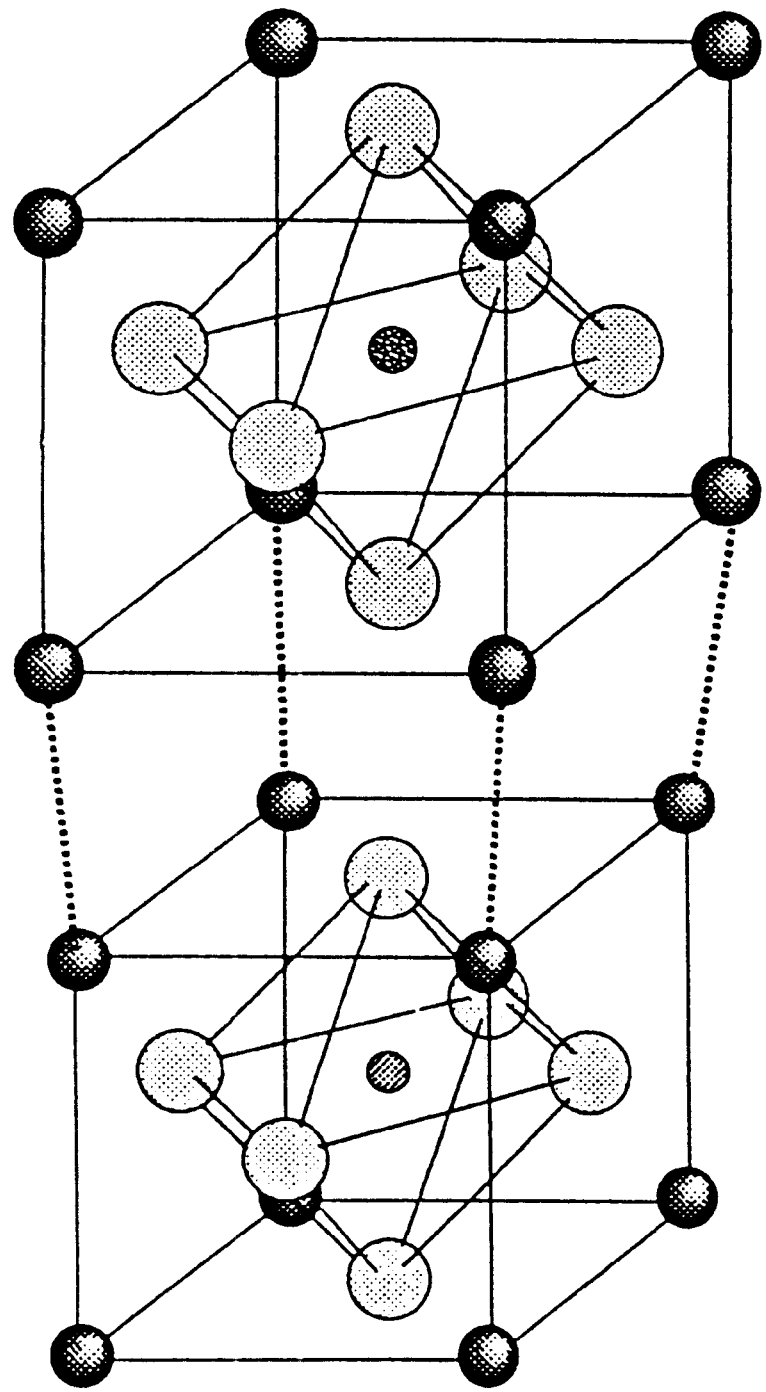
FIG. 13 is a schematic diagram for explaining the concept of ferroelectricity induced by lattice distortion.
Figure 14:
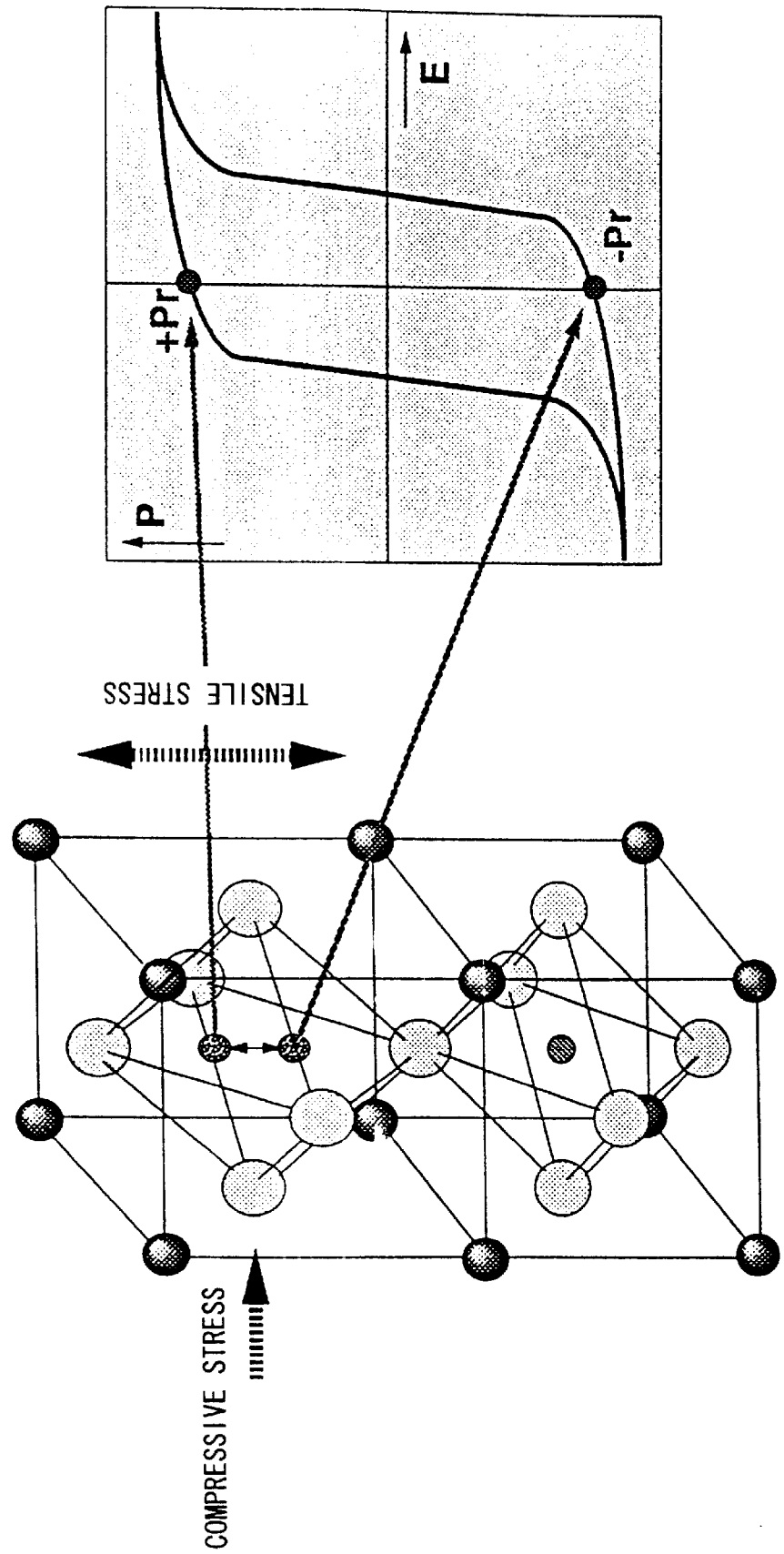
FIG. 14 is a schematic diagram for explaining the concept of ferroelectricity induced by lattice distortion.

According to the first embodiment, the following various advantages are obtained. That is, basic optical devices, namely, GaAs semiconductor laser 3, optical modulation device 7 and optical detection devices 15 and 16, can be integrated in a high density on the single-crystal Si substrate 1. Additionally, since the GaAs semiconductor laser 3 is previously fabricated separately in an ordinary manufacturing process and bonded to the single-crystal Si substrate 1 by atomic layer bonding, its integration is easier than epitaxially growing semiconductor layers directly on the single-crystal Si substrate 1. Moreover, since the oxide thin films forming the optical modulation device 7 and the optical detection devices 15 and 16 are made by epitaxial growth, quite a large two-dimensional compression stress as large as several GPa degrees, which has never expected heretofore, can be produced in their functional thin film portions, namely, the PLZT thin film 5 of the optical modulation device 7 and the $PbTiO_3$ thin films 9 and 13 of the optical detection devices 15 and 16, and the nonlinear optical characteristics can be improved remarkably. In this respect, images on the concept of ferroelectricity induced by lattice distortion are shown in FIGS. 13 and 14, because there can be expected a surprising ferroelectricity resulting from a keen increase in Curie point caused by two dimensional compression stress introduced by lattice mismatching with the base lattice. Since this physical property depends on the thickness from the base layer, a superlattice period within an extent out of lattice relaxation will be appropriate.

As explained above, according to the first embodiment, the optical integrated oxide device with excellent characteristics, high reliability, high integration and high density can be realized by optimization of the structure.

Figure 15:
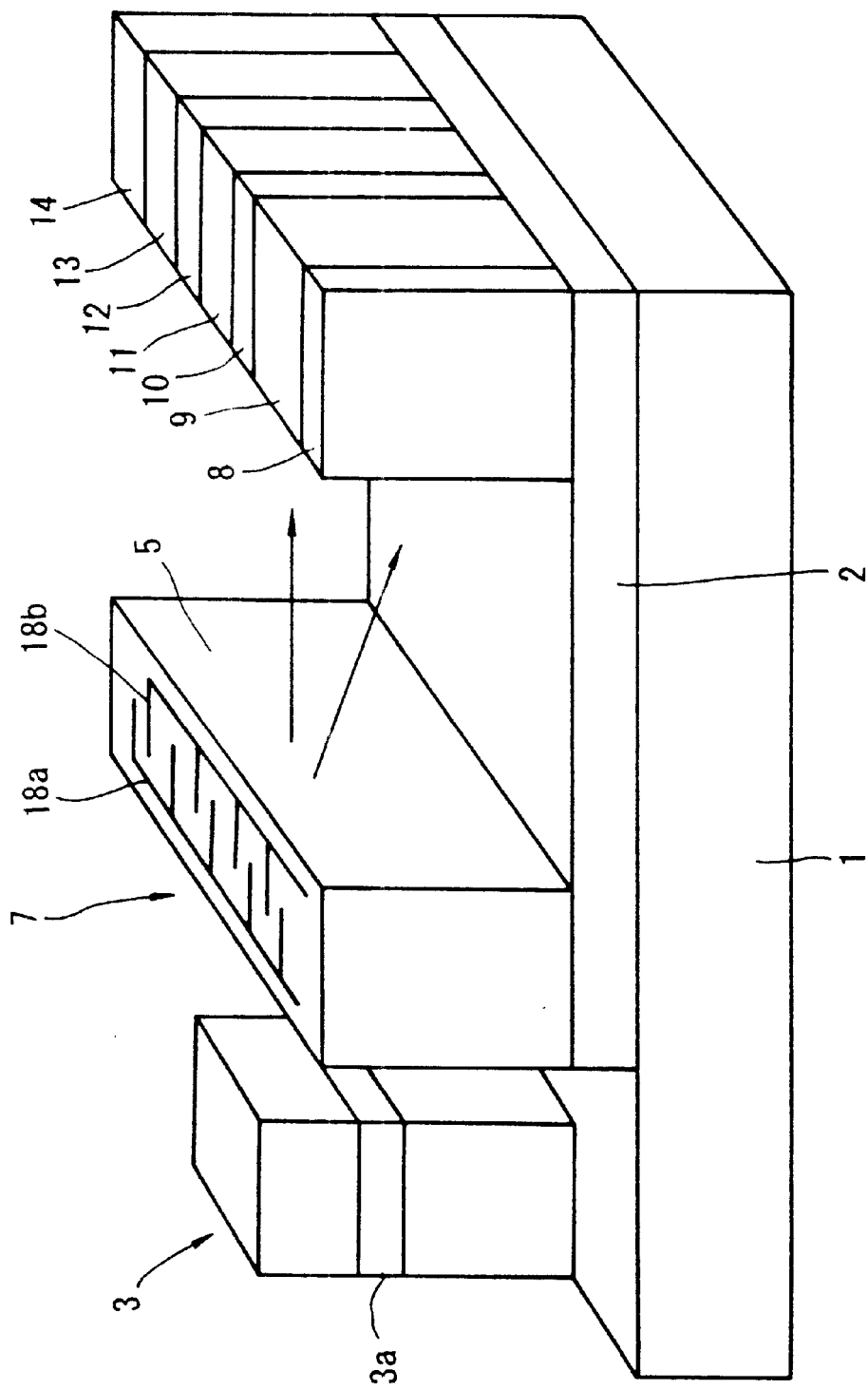
FIG. 15 is a perspective view of an optical integrated oxide device according to the second embodiment of the invention.

FIG. 15 shows an optical integrated oxide device according to the second embodiment of the invention. As shown in FIG. 15, in the optical integrated oxide device according to the second embodiment, the optical modulation device 7 is made of a PLZT thin film having formed thereon comb-shaped electrodes 18a, 18b. In the optical modulation device 7, a distribution of refractive index can be made along the plane of the PLZT thin film 5 by applying a voltage across the comb-shaped electrodes 18a, 18b. Therefore, light entering into the optical modulation device 7 can be changed in propagating direction within the plane. In this respect, the optical detection devices 15 and 16 are aligned in a transverse direction (parallel to the substrate surface). In the other respects, the embodiment shown here is the same as the optical integrated oxide device according to the first embodiment, and explanation thereof is omitted here.

According to the optical integrated oxide device according to the second embodiment, in addition to the same advantages as those of the optical integrated oxide device according to the first embodiment, there is an additional advantage that it enables signal processing by transverse transmission of the optical signal.

Figure 16:
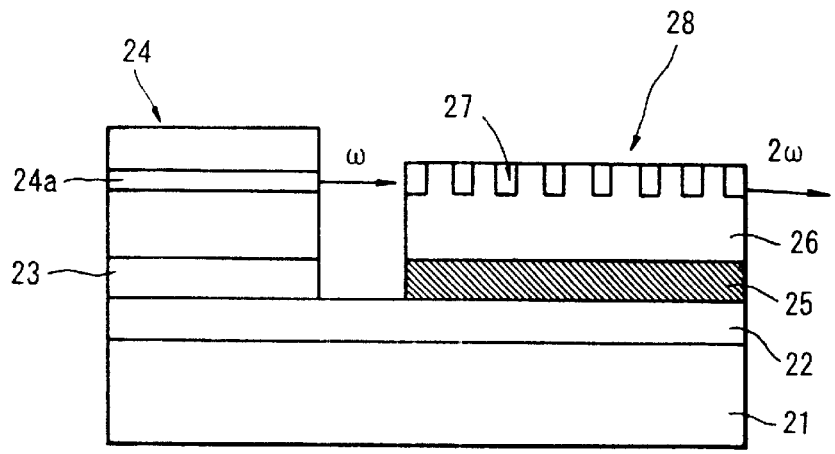
FIG. 16 is a perspective view of an optical integrated oxide device according to the third embodiment of the invention.

FIG. 16 shows an optical integrated oxide device according to the third embodiment of the invention. As shown in FIG. 16, in the optical integrated oxide device according to the third embodiment, a $MgAl_2O$, thin film 22 in (111) orientation is epitaxially grown on a (111) oriented single-crystal Si substrate 21. The $MgAl_2O$, thin film 22 is a buffer layer.

In a given location on the $MgAl_2O_4$ thin film 22, a GaN semiconductor layer 23 is made by epitaxial growth.

On another location of the $MgAl_2O_4$ thin film 22, a $SrRuO_3$ thin film 24 is stacked, and a $LiNbO_3$ thin film 25 is stacked on the $SrRuO_3$ thin film 24. In an upper portion of the $LiNbO_3$ thin film 25, a periodic domain inverted layer 26 is built in. The $SrRuO_3$ thin film 24, $LiNbO_3$ thin film and periodic domain inverted layer 26 form a second harmonic generating device 27. The $SrRuO_3$ thin film 24 is its electrode.

In the optical integrated oxide device having the above-explained structure according to the third embodiment, laser light of the frequency ω generated from the GaN semiconductor laser 23 passes through the second harmonic generating device 27, and light of the frequency 2 ω, e.g. second harmonic wave, is obtained.

Next explained is a manufacturing process of the optical integrated oxide device according to the third embodiment.

Figure 17:
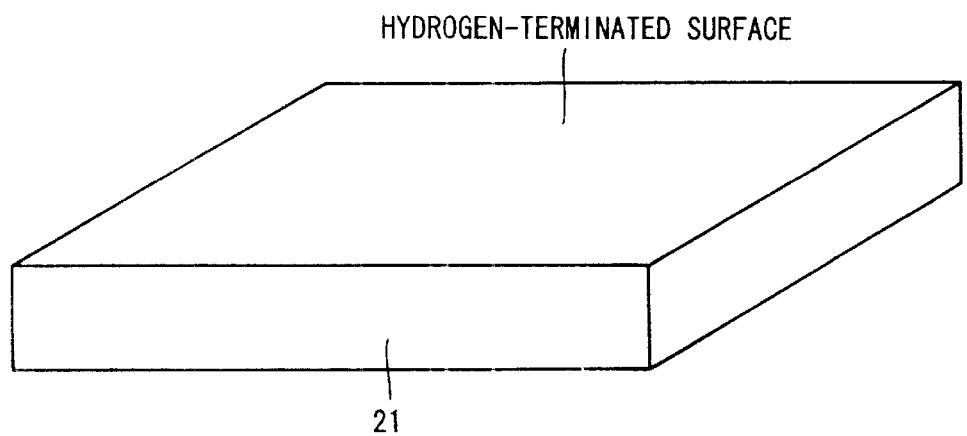
FIG. 17 is a perspective view of the optical integrated oxide device according to the third embodiment of the invention for explaining a manufacturing process thereof.

First, as shown in FIG. 17, after the surface of the (111) oriented single-crystal Si substrate 21 is cleaned by RCA cleaning, the cleaned surface is hydrogen terminated.

Figure 18:
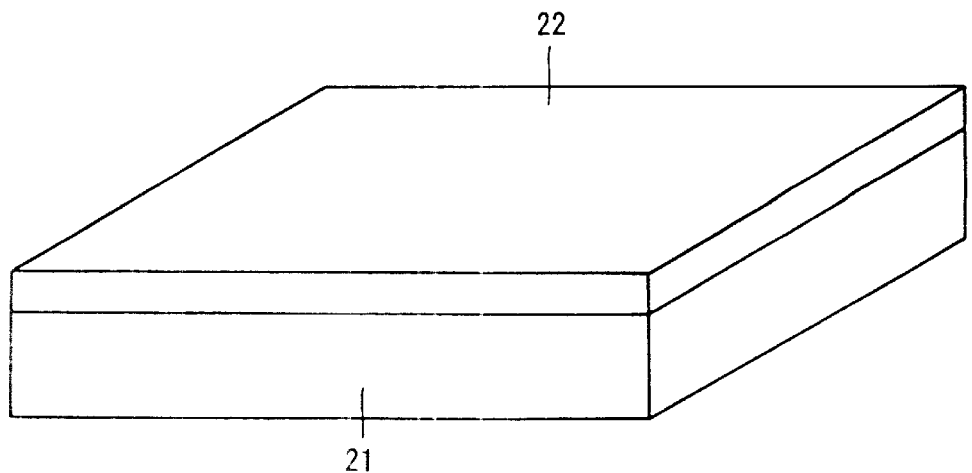
FIG. 18 is a perspective view of the optical integrated oxide device according to the third embodiment of the invention for explaining a manufacturing process thereof; for explaining.

Next, as shown in FIG. 18, the $MgAl_2O_4$ thin film 22 is epitaxially grown on the single-crystal Si substrate 21 by MOCVD. The epitaxial growth of the $MgAl_2O_4$ thin film 22 by MOCVD is performed in the following manner. As a metal organic compound, here is used a complex metal alkoxide, magnesium di-aluminum isopropoxide ($MgAl_2(OC_3H_7)_8$). The complex metal alkoxide significantly facilitates growth of a stoichiometric composition, using a single source of source materials. It is not easy to independently control a metal organic compound source material of Mg and a metal organic compound source material of Al. However, when the complex metal alkoxide is used as the source material, it is sufficient to control a single vapor pressure before the temperature exceeds its decomposition temperature, and growth can be made very easily. More specifically, by keeping a single body of $MgAl_2(OC_3H_7)_8$ at a predetermined temperature, thereby maintaining a constant vapor pressure and using a source material gas produced thereby, the growth is effected. An appropriate temperature of the substrate during the growth is, for example 700° C.

There is a proposal to once solve the complex metal alkoxide $MgAl_2(OC_3H_7)$ into an organic solvent and introducing it into an atomizer to obtain the source material gas ((66) J. Mater. Res., 9, 1333–1336(1994)). This method might be excellent in growth rate; however, it is not certain whether a good quality film can be made. The report certainly reports on epitaxial growth of a $MgAl_2O_4$ thin film on Si(100) and Mg(100), but films obtained thereby are all thick. It appears that thick grown films merely result in maintaining an epitaxial relationship with the base layers, and epitaxial property of the thin film itself cannot be estimated only from this.

Figure 19:
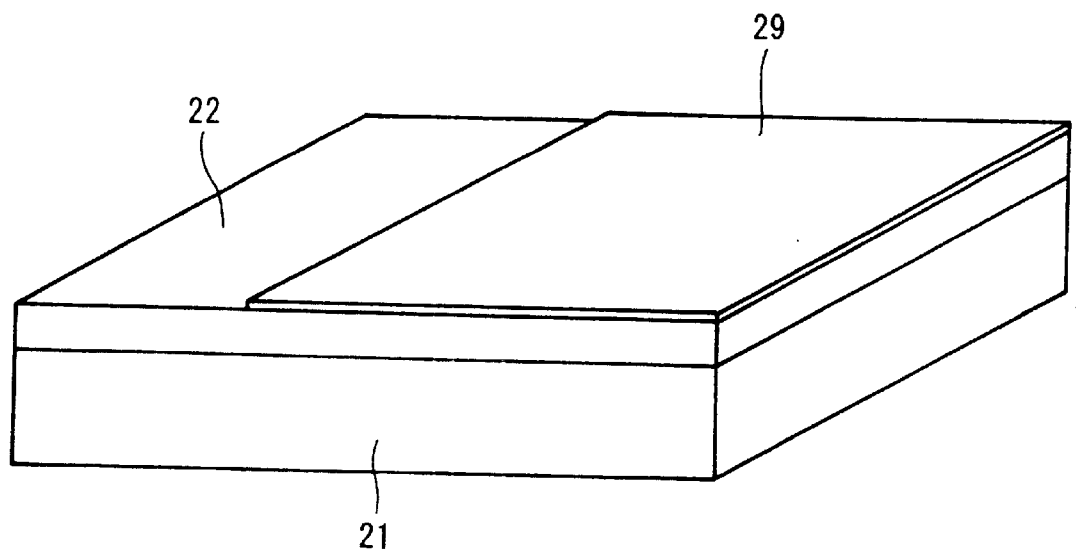
FIG. 19 is a perspective view of the optical integrated oxide device according to the third embodiment of the invention for explaining a manufacturing process thereof.

Next as shown in FIG. 19, a mask 27 is formed on a predetermined region of the $MgAl_2O_4$ thin film 22.

Figure 20:
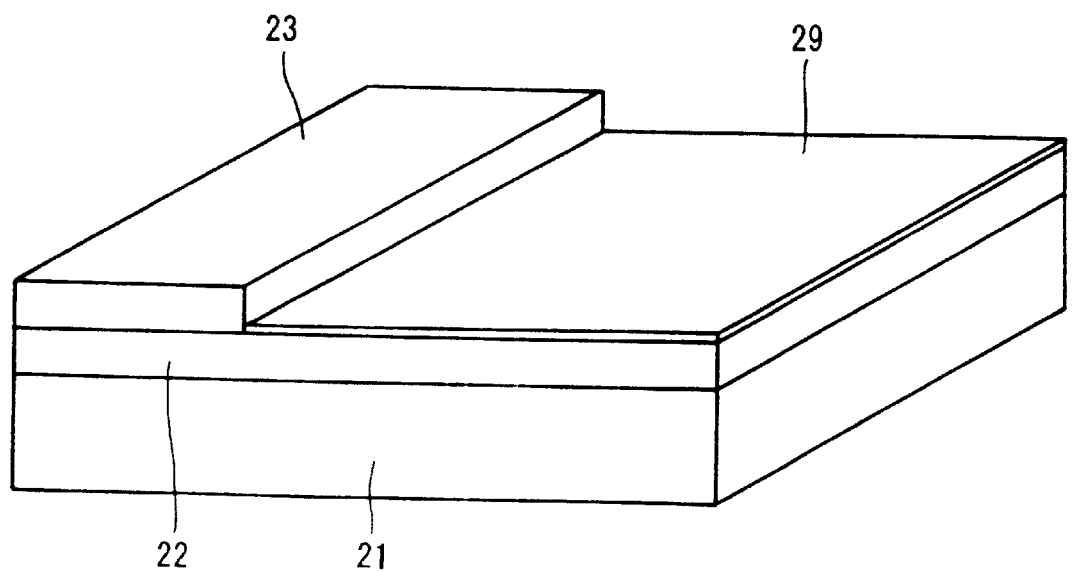
FIG. 20 is a perspective view of the optical integrated oxide device according to the third embodiment of the invention for explaining a manufacturing process thereof.

Then, as shown in FIG. 20, on a region of the $MgAl_2O_4$ thin film 22 not covered by the mask 27, the GaN thin film 28 in (0001) orientation is epitaxially grown by MOCVD. For the epitaxial growth of the GaN thin film 28, trimethyl gallium (TMGa) and ammonia ($NH_3$), for example, are used as the source material. It was already reported that a (0001) oriented GaN thin film epitaxially grew on a (111) oriented $MgAl_2O_4$ thin film ((67) Appl. Phys. Lett., 68, 337–339 (1996), (68) Appl. Phys. Lett., 68, 1129–1131(1996)).

Figure 21:
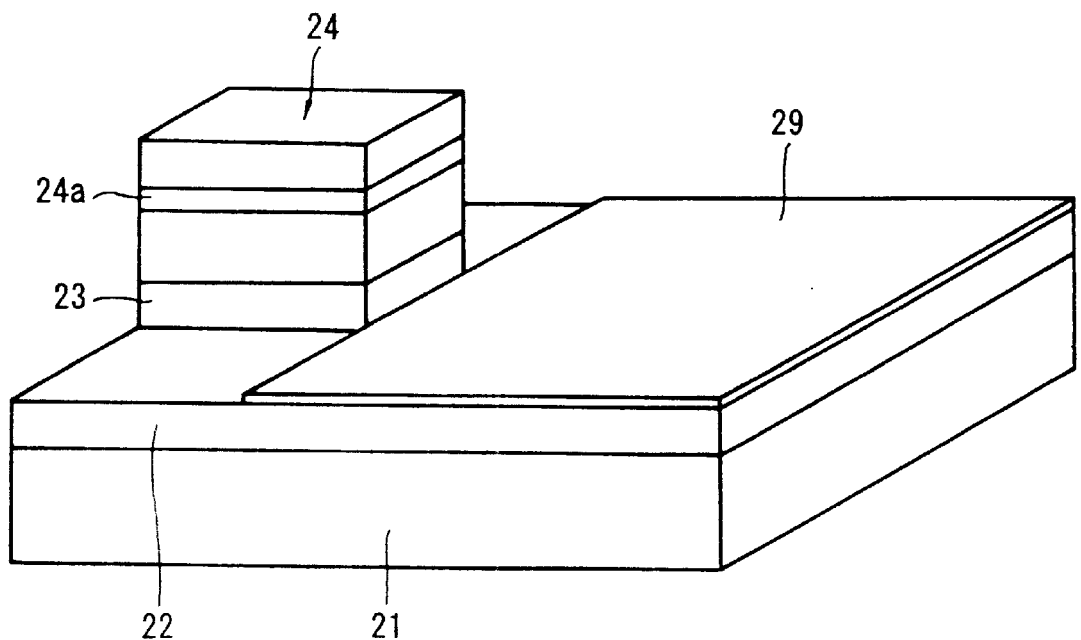
FIG. 21 is a perspective view of the optical integrated oxide device according to the third embodiment of the invention for explaining a manufacturing process thereof.

Next, on the GaN thin film 28, GaN semiconductor layers including a GaN/InGaN heterojunction are epitaxially grown sequentially by MOCVD, and are patterned into a predetermined configuration by etching. As a result, the GaN semiconductor laser 23 is made as shown in FIG. 21. The method for making a GaN semiconductor laser was already reported (for example, (69) Appl. Phys. Lett., 62, 2390 (1993)).

Figure 22:
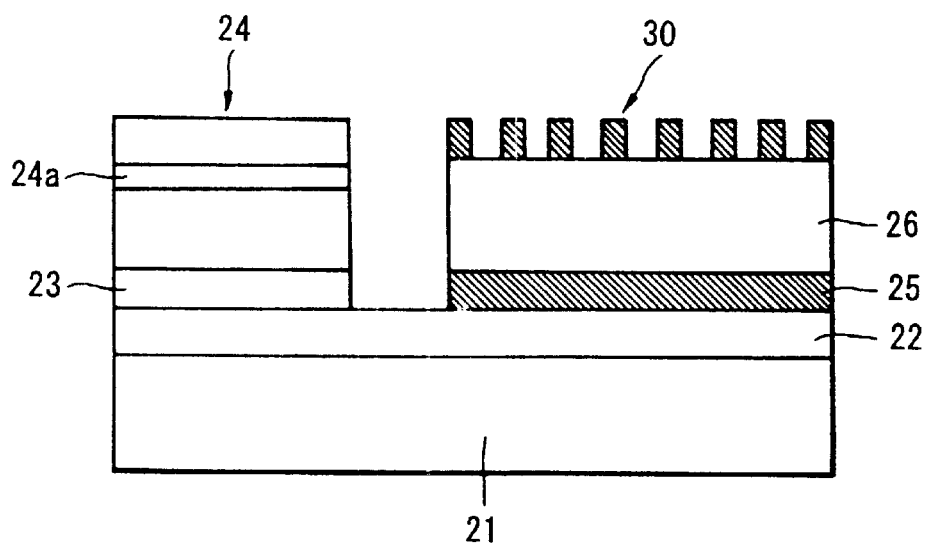
FIG. 22 is a perspective view of the optical integrated oxide device according to the third embodiment of the invention for explaining a manufacturing process thereof.

Next, as shown in FIG. 22, the (111) oriented $SrRuO_3$ thin film 23 is epitaxially grown on another predetermined region of the $MgAl_2O_4$ thin film 22 by MOCVD or MBE.

Further grown epitaxially is the $LiNbO_3$ thin film 25 by MBE or MOCVD.

Then, after a Pt film is formed on the $LiNbO_3$ thin film 25 by vapor deposition, for example, the Pt film is patterned by etching to form a poling comb-shaped electrode 29.

After that, a predetermined pulsating voltage is applied across the $SrRuO_3$ thin film 23 as the lower electrode and the poling comb-shaped electrode 29, to make a periodic polarization inverted structure, namely, periodic domain inverted layer 26, in the upper portion of the $LiNbO_3$ thin film 25. The poling method are reported in detail ((70) Appl. Phys. Lett., 62, 435–436(1993)).

The poling comb-shaped electrode 29 is next removed by etching.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, in the first and second embodiments, a thin film of an artificial superlattice, $(SrTiO_3)_n(PbTiO_3)_m$, for example, may be used in lieu of the $PbTiO_3$ thin films 9, 13 of the optical detection devices 15, 16. In this case, it would be needless to say that the perovskite $PbTiO_3$ (001) film epitaxially grows with a more sufficient lattice distortion than the lattice constant in bulk.

In the first embodiment, a $(SrCa)RuO_3$ thin film, $Sr_2RuO_4$ thin film, superconductive oxide thin film, and so on, may be used instead of the $SrRuO_3$ thin films 4 and 6 forming electrodes of the optical modulation device 7. When a $Sr_2RuO_4$ thin film is used, its orientation should be (001).

In the second embodiment, a superlattice of a $LiNbO_3$ thin film and a $LiTaO_3$ thin film may be used in lieu of the $LiNbO_3$ thin film 26 of the second harmonic generating device 28. By using the $LiNbO_3/LiTaO_3$ superlattice, a higher efficiency is expected. MBE is an appropriate method for growth of the LiNbO$_3$/LiTaO$_3$ superlattice. The crystal structure obtained thereby is not an ilmenite crystal structure, but a perovskite-regulated crystal structure as far as films are not thick. Therefore, their orientation will be (111). In this case, however, since these films are poled by the poling comb-shaped electrodes 29, they need not be oriented so. Furthermore, a K(Nb$_{1-x}$Ta$_x$)O$_3$ thin film, for example, may be used instead of the LiNbO$_3$ thin film 26. The poling comb-shaped electrode 29 may be left there without removing it, if appropriate. This is because second harmonic waves with the half wavelength can be obtained when light enters into the periodic domain inverted layer 27.

In the first, second and third embodiments, the use of MOCVD or MBE are proposed as methods for growing thin films. However, any other appropriate atomic layer growth method, such as reactive evaporation or laser abrasion (often called pulse laser deposition or laser MBE), may be employed.

As explained above, according to the silicon-based functional matrix substrate according to the invention, both an oxide device such as oxide optical device, ferroelectric nonvolatile memory, oxide superconductive device, and so forth, and a semiconductor light emitting device such as semiconductor laser can be integrated in an optimum structure on a common substrate.

According to the optical integrated oxide structure according to the invention, both an oxide device such as oxide optical device, ferroelectric nonvolatile memory, oxide superconductive device, and so forth, and a semiconductor light emitting device such as semiconductor laser can be integrated in an optimum structure on a common substrate.

What is claimed is:

1. An optical integrated oxide device comprising:
   a single-crystal silicon substrate having thereon a first region where said single-crystal silicon substrate itself appears, and a second region where a cerium oxide layer is preferentially oriented or epitaxially gown in the (100) orientation on said single-crystal silicon substrate; and
   a semiconductor light emitting device bonded on said first region by atomic layer bonding,
   wherein at least one of an optical modulation device and an optical detection device is made on said cerium oxide layer by epitaxial growth.

2. An optical integrated oxide device comprising:
   a single-crystal silicon substrate having thereon a first region where said single-crystal silicon substrate itself appears, and a second region where a magnesium aluminum spinel layer is preferentially oriented or epitaxially grown in the (100) orientation on said single-crystal silicon substrate; and
   a semiconductor light emitting device bonded on said first region by atomic layer bonding,
   wherein at least one of an optical modulation device and an optical detection device is made on said magnesium aluminum spinel layer by epitaxial growth.

3. An optical integrated oxide device comprising:
   a cerium oxide layer preferentially oriented or epitaxially grown in the (100) orientation on a single-crystal substrate, and a magnesium aluminum spinel layer epitaxially grown in a selective region on said cerium oxide layer; and
   a semiconductor light emitting device formed on said magnesium aluminum spinel layer by epitaxial growth, and at least one of an optical modulation device and an optical detection device formed on said cerium oxide layer by epitaxial growth.

4. The optical integrated oxide device according to claim 3 wherein said single-crystal silicon substrate is (100) oriented.

5. An optical integrated oxide device comprising:
   a cerium oxide layer preferentially oriented or epitaxially grown in the (100) orientation on a single-crystal substrate, and a magnesium aluminum spinel layer epitaxially grown on said cerium oxide layer; and
   at least two of a semiconductor light emitting device, an optical modulation device and an optical detection device formed on said magnesium aluminum spinel layer by epitaxial growth.

6. The optical integrated oxide device according to claim 5 wherein said single-crystal silicon substrate is (100) oriented.

7. The optical integrated oxide device according to claim 1 wherein said optical modulation device includes an oxide thin film having a perovskite-related crystal structure, said optical modulation device having electrodes in upper and lower portions thereof.

8. The optical integrated oxide device according to claim 2 wherein said optical modulation device includes an oxide thin film having a perovskite-related crystal structure, said optical modulation device having electrodes in upper and lower portions thereof.

9. The optical integrated oxide device according to claim 1 wherein said optical modulation device includes an oxide thin film having a perovskite-related crystal structure, said optical modulation device having an electrode only in an upper portion thereof.

10. The optical integrated oxide device according to claim 2 wherein said optical modulation device includes an oxide thin film having a perovskite-related crystal structure, said optical modulation device having an electrode only in an upper portion thereof.

11. The optical integrated oxide device according to claim 1 wherein said optical modulation device and said optical detection device each contains a ferroelectric, piezoelectric or pyroelectric oxide thin film.

12. The optical integrated oxide device according to claim 2 wherein said optical modulation device and said optical detection device each contains a ferroelectric, piezoelectric or pyroelectric oxide thin film.

13. The optical integrated oxide device according to claim 11 wherein said ferroelectric, piezoelectric or pyroelectric oxide thin film is an oxide thin film made of (Ba, Sr, Ca, Pb, Mg, Bi, Ag, Na, K, Y, Sb, Li, Ln)(Ti, Zr, Sn, Th, Ce, Ru, Rh, Ir, Cu, Ga, Al, Nb, Ta, Sb, Bi, Pb)O$_3$ (where Ba+Sr+Ca+Pb+Mg+Bi+Ag+Na+K+Y+Sb+Li+Ln=1, Ti+Zr+Sn+Th+Ce+Ru+Rh+Ir+Cu+Ga+Al+Nb+Ta+Sb+Bi+Pb=1) having a perovskite crystal structure, an ilmenite crystal structure or a GdFeO$_3$ crystal structure.

14. The optical integrated oxide device according to claim 11 wherein said ferroelectric, piezoelectric or pyroelectric oxide thin film is made of an oxide artificial superlattice including at least two kinds of oxide thin films made of (Ba, Sr, Ca, Pb, Mg, Bi, Ag, Na, K, Y, Sb, Li, Ln)(Ti, Zr, Sn, Th, Ce, Ru, Rh, Ir, Cu, Ga, Al, Nb, Ta, Sb, Bi, Pb)O$_3$ (where Ba+Sr+Ca+Pb+Mg+Bi+Ag+Na+K+Y+Sb+Li+Ln=1, Ti+Zr+Sn+Th+Ce+Ru+Rh+Ir+Cu+Ga+Al+Nb+Ta+Sb+Bi+Pb=1) having a perovskite crystal structure, an ilmenite crystal structure or a GdFeO$_3$ crystal structure.

15. The optical integrated oxide device according to claim 12 wherein said ferroelectric, piezoelectric or pyroelectric oxide thin film is an oxide thin film made of (Ba, Sr, Ca, Pb, Mg, Bi, Ag, Na, K, Y, Sb, Li, Ln)(Ti, Zr, Sn, Th, Ce, Ru, Rh, Ir, Cu, Ga, Al, Nb, Ta, Sb, Bi, Pb)O$_3$ (where Ba+Sr+Ca+Pb+Mg+Bi+Ag+Na+K+Y+Sb+Li+Ln=1, Ti+Zr+Sn+Th+Ce+Ru+Rh+Ir+Cu+Ga+Al+Nb+Ta+Sb+Bi+Pb=1 having a perovskite crystal structure, an ilmenite crystal structure or a GdFeO$_3$ crystal structure.

16. The optical integrated oxide device according to claim 12 wherein said ferroelectric, piezoelectric or pyroelectric oxide thin film is made of an oxide artificial superlattice including at least two kinds of oxide thin films made of (Ba, Sr, Ca, Pb, Mg, Bi, Ag, Na, K, Y, Sb, Li, Ln)(Ti, Zr, Sn, Th, Ce, Ru, Rh, Ir, Cu, Ga, Al, Nb, Ta, Sb, Bi, Pb)O$_3$ (where Ba+Sr+Ca+Pb+Mg+Bi+Ag+Na+K+Y+Sb+Li+Ln=1, Ti+Zr+Sn+Th+Ce+Ru+Rh+Ir+Cu+Ga+Al+Nb+Ta+Sb+Bi+Pb=1) having a perovskite crystal structure, an ilmenite crystal structure or a GdFeO$_3$ crystal structure.

17. The optical integrated oxide device according to claim 3, which is bonded to an electronic refrigerating device.

18. The optical integrated oxide device according to claim 5, which is bonded to an electronic refrigerating device.

* * * * *